(12) United States Patent
Lin et al.

(10) Patent No.: US 10,067,824 B2
(45) Date of Patent: Sep. 4, 2018

(54) ERROR PROCESSING METHOD, MEMORY STORAGE DEVICE AND MEMORY CONTROLLING CIRCUIT UNIT

(71) Applicant: PHISON ELECTRONICS CORP., Miaoli (TW)

(72) Inventors: Wei Lin, Taipei (TW); Yu-Cheng Hsu, Yilan County (TW); Shao-Wei Yen, Kaohsiung (TW); Tien-Ching Wang, Kaohsiung (TW); Yu-Hsiang Lin, Yunlin County (TW); Kuo-Hsin Lai, Hsinchu County (TW); Li-Chun Liang, Kaohsiung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 90 days.

(21) Appl. No.: 14/565,437

(22) Filed: Dec. 10, 2014

(65) Prior Publication Data

US 2016/0098316 A1    Apr. 7, 2016

(30) Foreign Application Priority Data

Oct. 3, 2014  (TW) .............................. 103134558 A

(51) Int. Cl.
*G06F 11/00*    (2006.01)
*G06F 11/10*    (2006.01)
(Continued)

(52) U.S. Cl.
CPC .......... *G06F 11/1068* (2013.01); *G11C 29/42* (2013.01); *G11C 29/44* (2013.01);
(Continued)

(58) Field of Classification Search
None
See application file for complete search history.

(56) References Cited

U.S. PATENT DOCUMENTS 6,883,126 B1 *  4/2005  Herman ................ G11B 20/18
                                                  714/723
8,914,712 B2 * 12/2014  Ramaraju ........... G06F 11/0754
                                                  714/767
(Continued)

FOREIGN PATENT DOCUMENTS

EP          2709110         3/2014

OTHER PUBLICATIONS

"Office Action of Taiwan Counterpart Application," dated Dec. 23, 2015, p. 1-p. 8.

*Primary Examiner* — Mujtaba M Chaudry
(74) *Attorney, Agent, or Firm* — JCIPRNET

(57) ABSTRACT

An error processing method for a rewritable non-volatile memory module, a memory storage device and a memory controlling circuit unit are provided. The rewritable non-volatile memory module includes a plurality of memory cells. The error processing method includes: sending a first read command sequence for reading a plurality of bits from the memory cells; performing a first decoding on the bits; determining whether each error belongs to a first type error or a second type error if the bits have at least one error; recording related information of a first error in the at least one error if the first error belongs to the first type error; and not recording the related information of the first error if the first error belongs to the second type error. Accordingly, errors with particular type may be processed suitably.

36 Claims, 13 Drawing Sheets

(51) Int. Cl.
  *G11C 29/52* (2006.01)
  *G11C 29/42* (2006.01)
  *G11C 29/44* (2006.01)
  *G11C 11/56* (2006.01)
  *G11C 16/34* (2006.01)
  *G11C 29/04* (2006.01)
(52) U.S. Cl.
  CPC .......... *G11C 29/52* (2013.01); *G11C 11/5642* (2013.01); *G11C 16/349* (2013.01); *G11C 2029/0409* (2013.01)

(56) References Cited

U.S. PATENT DOCUMENTS

| | | | | |
|---|---|---|---|---|
| 9,329,948 B2* | 5/2016 | Li | ........................ | G06F 11/1666 |
| 2009/0055680 A1* | 2/2009 | Honda | ................. | G06F 11/1068 |
| | | | | 714/5.1 |
| 2010/0077280 A1* | 3/2010 | Ootsuka | ............... | G11C 7/1006 |
| | | | | 714/758 |
| 2011/0041005 A1* | 2/2011 | Selinger | .................. | G06F 11/10 |
| | | | | 714/719 |
| 2011/0314329 A1* | 12/2011 | Thilagar | ............. | G06F 11/0709 |
| | | | | 714/25 |
| 2012/0233498 A1* | 9/2012 | Ramaraju | ........... | G06F 11/1064 |
| | | | | 714/23 |
| 2012/0278681 A1* | 11/2012 | Moyer | ................ | G06F 11/1016 |
| | | | | 714/763 |
| 2013/0047045 A1* | 2/2013 | Hu | ...................... | G06F 11/1048 |
| | | | | 714/708 |
| 2013/0061113 A1* | 3/2013 | Kim | .................... | G06F 11/1048 |
| | | | | 714/758 |
| 2014/0204671 A1* | 7/2014 | Sharon | ................ | G11C 11/5642 |
| | | | | 365/185.09 |
| 2015/0154064 A1* | 6/2015 | Ghaly | ................. | G06F 11/0793 |
| | | | | 714/6.11 |
| 2015/0200688 A1* | 7/2015 | Pan | ................... | H03M 13/3927 |
| | | | | 714/794 |
| 2016/0092284 A1* | 3/2016 | Shur | ..................... | G06F 11/076 |
| | | | | 714/704 |

\* cited by examiner

ERROR PROCESSING METHOD, MEMORY STORAGE DEVICE AND MEMORY CONTROLLING CIRCUIT UNIT

CROSS-REFERENCE TO RELATED APPLICATION

This application claims the priority benefit of Taiwan application serial no. 103134558, filed on Oct. 3, 2014. The entirety of the above-mentioned patent application is hereby incorporated by reference herein and made a part of this specification.

BACKGROUND

Technical Field

The invention relates to an error processing method, and more particularly, relates to an error processing method, a memory storage device and a memory controlling circuit unit for a rewritable non-volatile memory module.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, an error checking and correcting circuit is disposed inside a memory controller. The error checking and correcting circuit is configured to perform an error checking and correction on data read from the rewritable non-volatile memory module. However, based on the existing error checking and correction mechanism, it is not easy to find errors with particular type (e.g., errors induced by transmission of data on a bus).

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to an error processing method, a memory storage device, and a memory controlling circuit unit, which are capable of identifying errors with particular type and recording related information for later use.

An error processing method is provided according an exemplary embodiment of the invention for a rewritable non-volatile memory module having a plurality of memory cells, and the error processing method includes: sending a first read command sequence, wherein the first read command sequence is configured to read a plurality of bits from the memory cells, performing a first decoding on the bits; if the bits have at least one error, correcting the error, and determining whether each error belongs to a first type error or a second type error; recording related information of a first error in the at least one error if the first error belongs to the first type error; and not recording the related information of the first error if the first error belongs to the second type error.

A memory storage device is provided according to an exemplary embodiment of the invention and includes a connection interface unit, a rewritable non-volatile memory module and a memory controlling circuit unit. The connection interface unit is configured to couple to a host system. The rewritable non-volatile memory module includes a plurality of memory cells. The memory controlling circuit unit is coupled to the connection interface unit and the rewritable non-volatile memory module. The memory controlling circuit unit is configured to send a first read command sequence. The first read command sequence is configured to read a plurality of bits from the memory cells. The memory controlling circuit unit is further configured to perform a first decoding on the bits. If the bits have at least one error, the memory controlling circuit unit is further configured to correct the error and determine whether each error belongs to a first type error or a second type error. If a first error in the error belongs to the first type error, the memory controlling circuit unit is further configured to record related information of the first error. If the first error belongs to the second type error, the memory controlling circuit unit does not record the related information of the first error.

A memory controlling circuit unit is provided according to an exemplary embodiment of the invention and configured to control a rewritable non-volatile memory module. The rewritable non-volatile memory module includes a plurality of memory cell, and the memory controlling circuit unit includes a host interface, a memory interface, an error checking and correcting circuit, and a memory management circuit. The host interface is configured to couple to a host system. The memory interface is configured to couple to the rewritable non-volatile memory module, wherein the rewritable non-volatile memory module includes a plurality of memory cells. The memory management circuit is coupled to the host interface, the memory interface and the error checking and correcting circuit. The memory management circuit is configured to send a first read command sequence. The first read command sequence is configured to read a plurality of bits from the memory cells. The error checking and correcting circuit is configured to perform a first decoding on the bits. If the bits have at least one error, the error checking and correcting circuit is further configured to correct the error and the memory management circuit is further configured to determine whether each error belongs to a first type error or a second type error. If a first error in the error belongs to the first type error, the memory management circuit is further configured to record related information of the first error. If the first error belongs to the second type error, the memory management circuit does not record the related information of the first error.

An error processing method is provided according an exemplary embodiment of the invention for a rewritable non-volatile memory module having a plurality of memory cells, and the error processing method includes: sending a first read command sequence, wherein the first read command sequence is configured to read a plurality of bits from a first memory cell in the memory cells; performing a first decoding on the bits; if the bits have at least one error, correcting the error, and determining whether each error belongs to a first type error or a second type error; if the error includes the first type error, sending a write command sequence, wherein the write command sequence is configured to write the corrected bits into a second memory cell in the memory cells; and if each error belongs to the second type error, outputting the corrected bits, wherein the first memory cell is different from the second memory cell.

A memory storage device is provided according to an exemplary embodiment of the invention and includes a connection interface unit, a rewritable non-volatile memory module and a memory controlling circuit unit. The connection interface unit is configured to couple to a host system. The rewritable non-volatile memory module includes a plurality of memory cells. The memory controlling circuit unit is coupled to the connection interface unit and the rewritable non-volatile memory module. The memory controlling circuit unit is configured to send a first read command sequence. The first read command sequence is configured to read a plurality of bits from a first memory cell in the memory cells. The memory controlling circuit unit is further configured to perform a first decoding on the bits. If the bits have at least one error, the memory controlling circuit unit is further configured to correct the error and determine whether each error belongs to a first type error or a second type error. If the error includes the first type error, the memory controlling circuit unit is further configured to send a write command sequence. The write command sequence is configured to write the corrected bits into a second memory cell in the memory cells. If each error belongs to the second type error, the memory controlling circuit unit is further configured to output the corrected bits. The first memory cell is different from the second memory cell.

A memory controlling circuit unit is provided according to an exemplary embodiment of the invention and configured to control a rewritable non-volatile memory module. The rewritable non-volatile memory module includes a plurality of memory cell, and the memory controlling circuit unit includes a host interface, a memory interface, an error checking and correcting circuit, and a memory management circuit. The host interface is configured to couple to a host system. The memory interface is configured to couple to the rewritable non-volatile memory module, wherein the rewritable non-volatile memory module includes a plurality of memory cells. The memory management circuit is coupled to the host interface, the memory interface and the error checking and correcting circuit. The memory management circuit is configured to send a first read command sequence. The first read command sequence is configured to read a plurality of bits from a first memory cell in the memory cells. The error checking and correcting circuit is configured to perform a first decoding on the bits. If the bits have at least one error, the error checking and correcting circuit is further configured to correct the error and the memory management circuit is further configured to determine whether each error belongs to a first type error or a second type error. If the error includes the first type error, the memory management circuit is further configured to send a write command sequence. The write command sequence is configured to write the corrected bits into a second memory cell in the memory cells. If each error belongs to the second type error, the memory management circuit is further configured to output the corrected bits. The first memory cell is different from the second memory cell.

Based on the above, after the first decoding is performed on the read bits, if errors with particular type exist in the bits, the related information of the errors will be recorded for later use. Furthermore, the related information of errors not belonging to the particular type will not be recorded to save the memory space.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
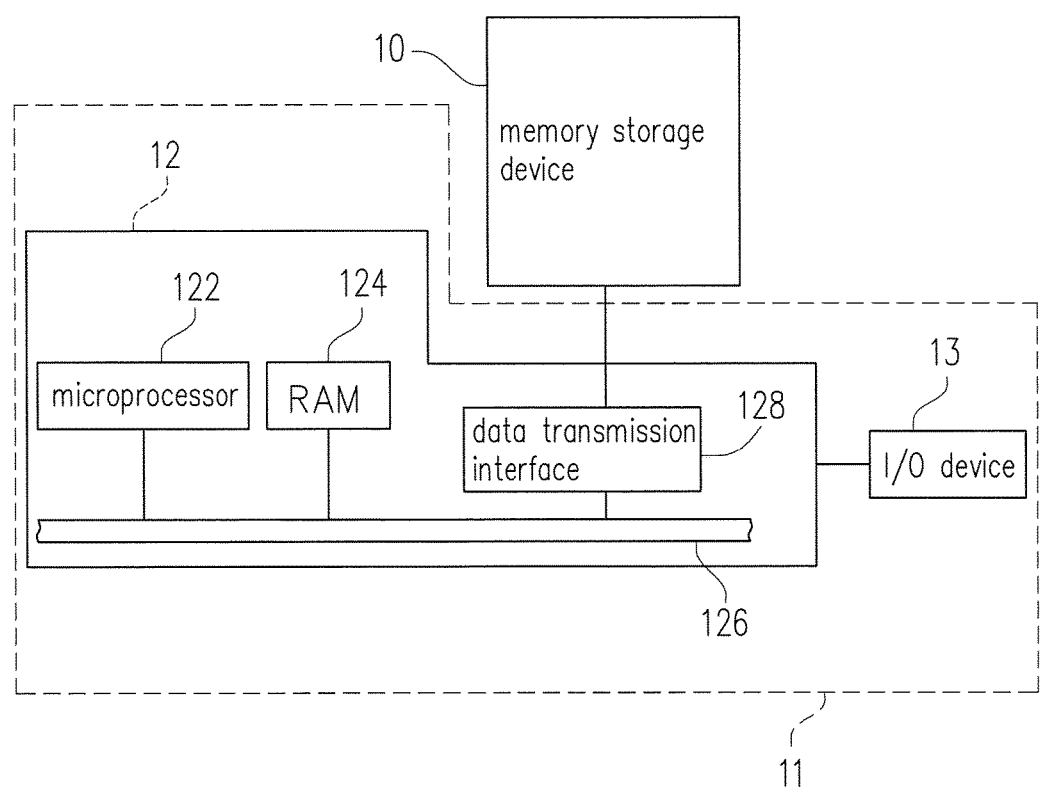
FIG. 1 is a schematic diagram illustrating a host system and a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a," (or "an") "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 2:
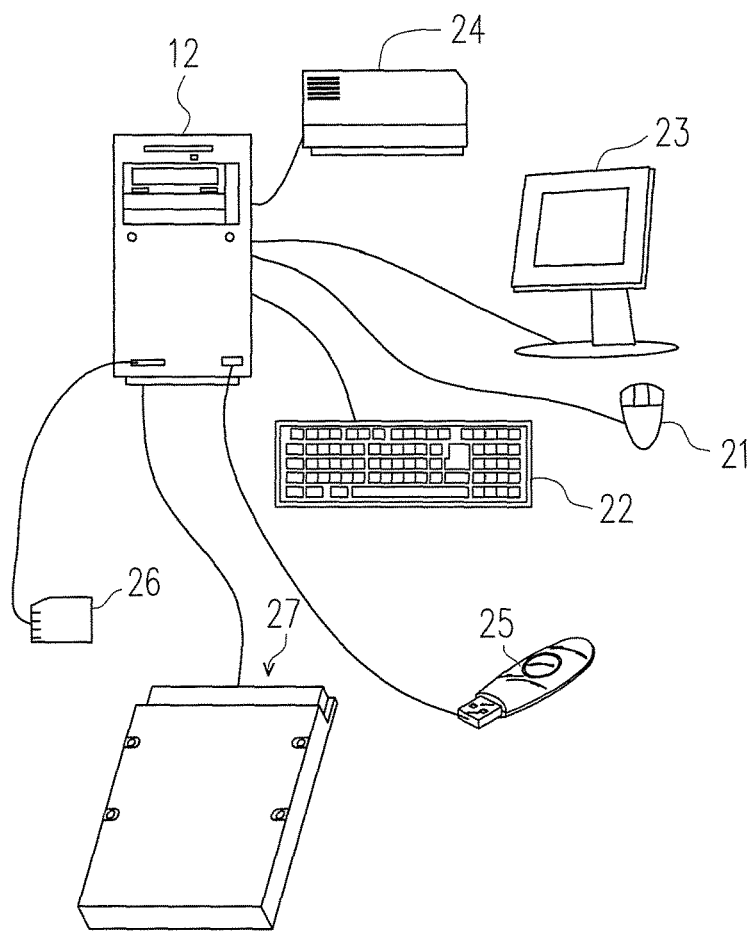
FIG. 2 is a schematic diagram of a computer, an input/output device, and a memory storage device according to an exemplary embodiment of the invention.

FIG. 1 is a schematic diagram illustrating a host system and a memory storage device according to an exemplary embodiment of the invention. FIG. 2 is a schematic diagram of a computer, an input/output device, and a memory storage device according to an exemplary embodiment of the invention.

Referring to FIG. 1, a host system 11 includes a computer 12 and an input/output (I/O) device 13. The computer 12 includes a microprocessor 122, a random access memory (RAM) 124, a system bus 126, and a data transmission interface 128. For example, the I/O device 13 includes a mouse 21, a keyboard 22, a display 23 and a printer 24 as shown in FIG. 2. It should be understood that the devices illustrated in FIG. 2 are not intended to limit the I/O device 13, and the I/O device 13 may further include other devices.

In an exemplary embodiment, the memory storage device 10 is coupled to other devices of the host system 11 through the data transmission interface 128. By using the microprocessor 122, the random access memory 124 and the Input/Output (I/O) device 13, data may be written into the memory storage device 10 or may be read from the memory storage device 10. For example, the memory storage device 10 may be a rewritable non-volatile memory storage device such as a flash drive 25, a memory card 26, or a solid state drive (SSD) 27 as shown in FIG. 2.

Figure 3:
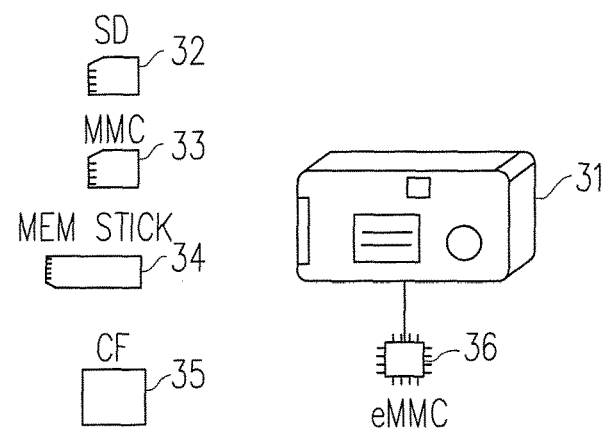
FIG. 3 is a schematic diagram illustrating a host system and a memory storage device according to an exemplary embodiment of the invention.

FIG. 3 is a schematic diagram illustrating a host system and a memory storage device according to an exemplary embodiment of the invention.

Generally, the host system 11 may be any system capable of substantially cooperating with the memory storage device 10 for storing data. In the present exemplary embodiment, the host system 11 is illustrated as a computer system. However, in another exemplary embodiment, the host system 11 may be a system such as a digital camera, a video camera, a telecommunication device, an audio player, or a video player. For example, when the host system is a digital camera (video camera) 31, the rewritable non-volatile memory storage device may be a SD card 32, a MMC card 33, a memory stick 34, a CF card 35 or an embedded storage device 36 (as shown in FIG. 3). The embedded storage device 36 includes an embedded MMC (eMMC). It should be mentioned that the eMMC is directly coupled to a substrate of the host system.

Figure 4:
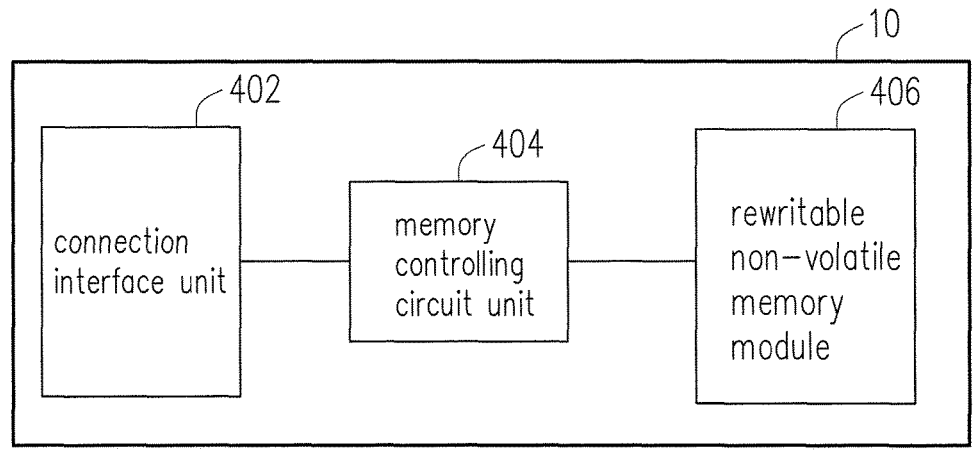
FIG. 4 is a schematic block diagram illustrating the memory storage device depicted in FIG. 1.

FIG. 4 is a schematic block diagram illustrating the memory storage device depicted in FIG. 1.

Referring to FIG. 4, the memory storage device 10 includes a connection interface unit 402, a memory controlling circuit unit 404 and a rewritable non-volatile memory module 406.

In the present exemplary embodiment, the connection interface unit 402 is compatible with a serial advanced technology attachment (SATA) standard. However, the invention is not limited thereto, and the connection interface unit 402 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form, so as to execute operations of writing, reading or erasing data in the rewritable non-volatile memory storage module 406 according to the commands of the host system 11.

The rewritable non-volatile memory module 406 is coupled to the memory controlling circuit unit 404 and configured to store data written from the host system 11. The rewritable non-volatile memory module 406 may be a Single Level Cell (SLC) NAND flash memory module, a Multi Level Cell (MLC) NAND flash memory module (i.e., a flash memory module capable of storing two bits of data in one memory cell), a Triple Level Cell (TLC) NAND flash memory module (i.e., a flash memory module capable of storing three bits of data in one memory cell), other flash memory modules or any memory module having the same features.

Figure 5:
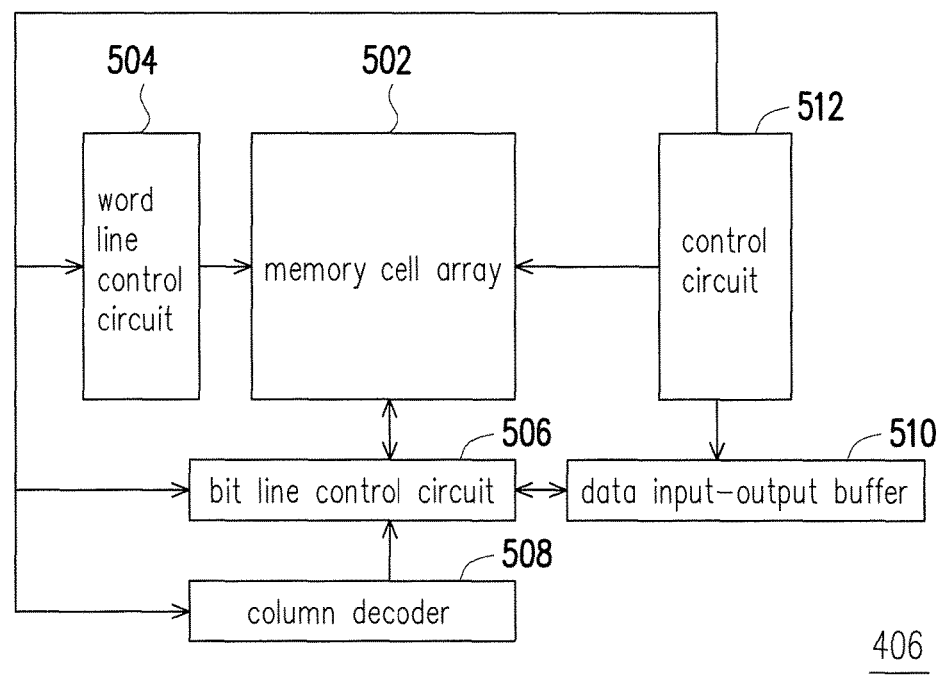
FIG. 5 is a schematic block diagram illustrating a rewritable non-volatile memory module according to an exemplary embodiment of the invention.
Figure 6:
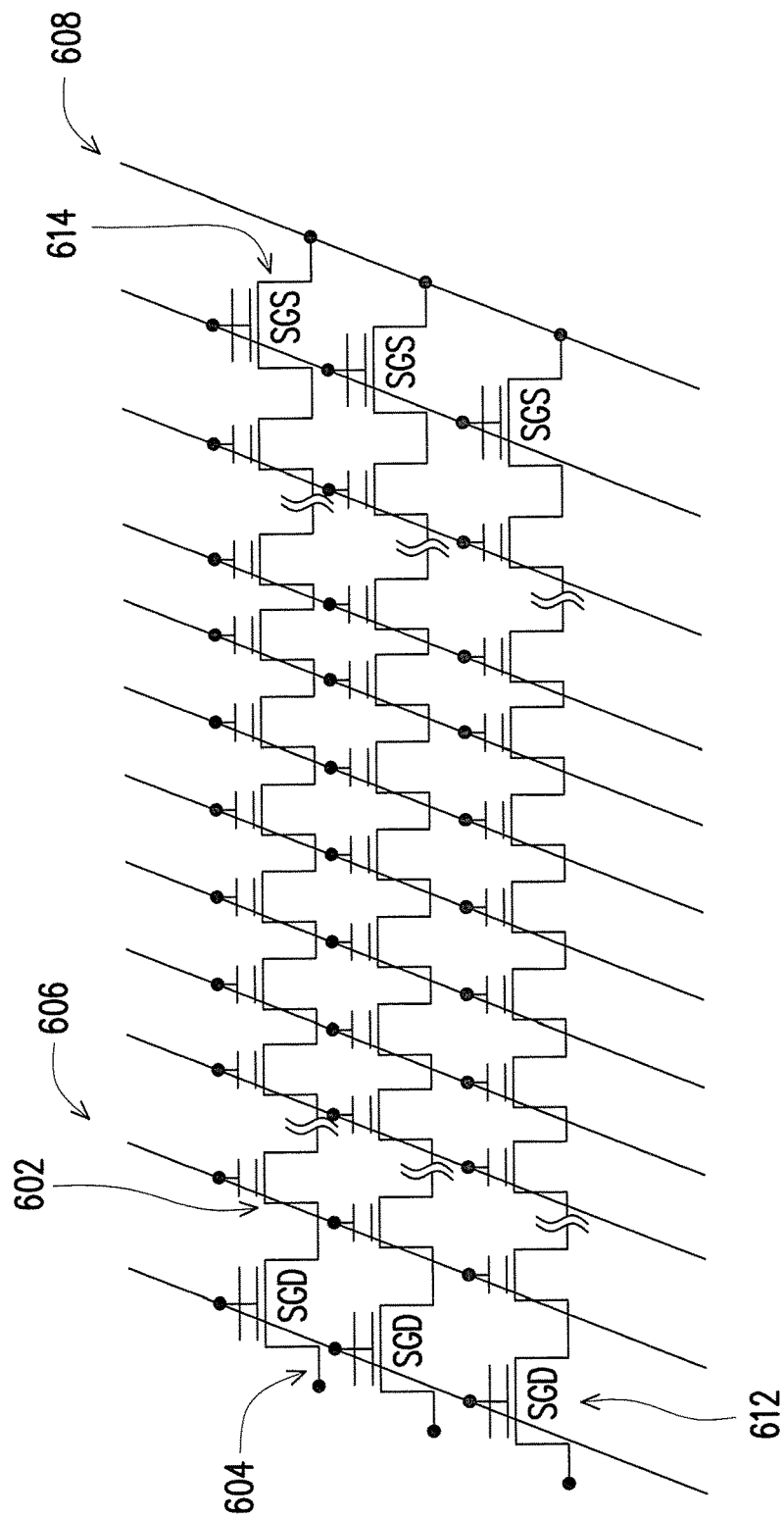
FIG. 6 is a schematic diagram illustrating a memory cell array according to an exemplary embodiment of the invention.

FIG. 5 is a schematic block diagram illustrating a rewritable non-volatile memory module according to an exemplary embodiment of the invention. FIG. 6 is a schematic diagram illustrating a memory cell array according to an exemplary embodiment of the invention.

Referring to FIG. 5, the rewritable non-volatile memory module 406 includes a memory cell array 502, a word line control circuit 504, a bit line control circuit 506, a column decoder 508, a data input-output buffer 510 and a control circuit 512.

In the present exemplary embodiment, the memory cell array 502 may include a plurality of memory cells 602 used to store data, a plurality of select gate drain (SGD) transistors 612, a plurality of select gate source (SGS) transistors 614, as well as a plurality of bit lines 604, a plurality of word lines 606, a common source line 608 connected to the memory cells (as shown in FIG. 6). The memory cell 602 is disposed at intersections of the bit lines 604 and the word lines 606 in a matrix manner (or in a 3D stacking manner). When a write command or a read command is received from the memory controlling circuit unit 404, the control circuit 512 controls the word line control circuit 504, the bit line control circuit 506, the column decoder 508, the data input-output buffer 510 to write the data into the memory cell array 502 or read the data from the memory cell array 502. Among them, the word line control circuit 504 is configured to control voltages applied to the word lines 606; the bit line control circuit 506 is configured to control voltages applied to the bit lines 604; the column decoder 508 is configured to select the corresponding bit line according to a row address in a command; and the data input-output buffer 510 is configured to temporarily store the data.

Each of the memory cells in the rewritable non-volatile memory module 406 may store one or more bits by changing a threshold voltage of the memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell." Each of the memory cells in the memory cell array 502 has a plurality of storage statuses depended on changes in the threshold voltage. Moreover, which of the storage statuses is the memory cell belongs to may be determined by read voltages, so as to obtain the one or more bits stored in the memory cell.

Figure 7:
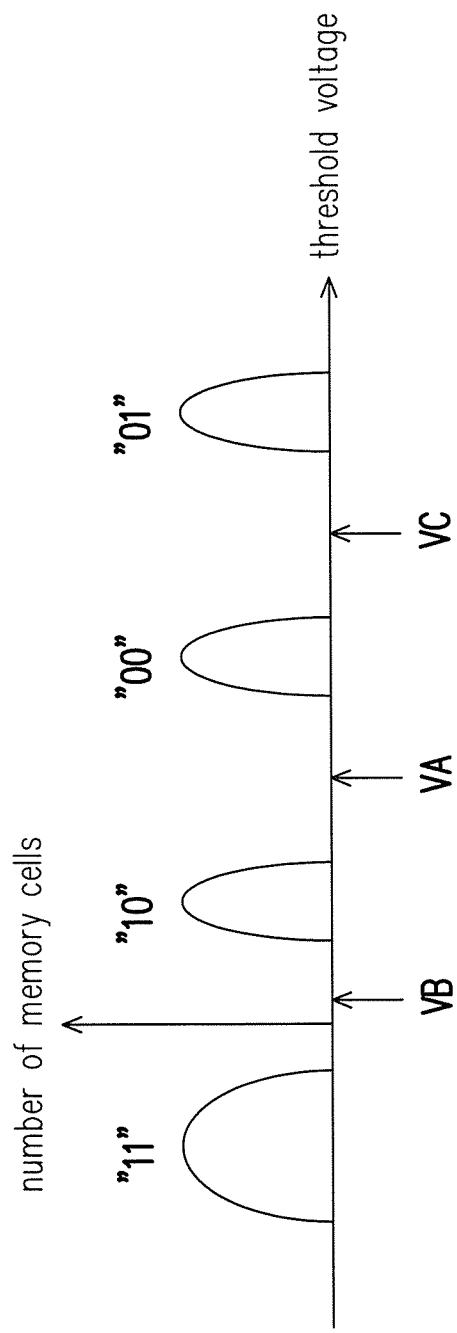
FIG. 7 is a histogram of a gate voltage corresponding to write data stored in the memory cell array according to an exemplary embodiment of the invention.

FIG. 7 is a histogram of a gate voltage corresponding to write data stored in the memory cell array according to an exemplary embodiment of the invention.

Referring to FIG. 7 that takes the MLC NAND flash memory for example, in which each of the memory cells has four storage statuses depended on different threshold voltages, and the statuses represent bits "11," "10," "00," and "01," respectively. In other words, each of the statuses includes a least significant bit (LSB) and a most significant bit (MSB). In the present exemplary embodiment, among the storage statuses (i.e., "11," "10," "00," and "01,") a first bit counted from the left is the LSB, and a second bit counted from the left is the MSB. Accordingly, in this exemplary embodiment, each of the memory cells may store two bits. It should be understood that, the storage statuses corresponding to the threshold voltage as illustrated in the FIG. 7 are merely an example. In another exemplary embodiment of the invention, the storage statuses corresponding to the threshold voltage may also have an arrangement of "11," "10," "01," and "00" that is arranged according to the threshold voltage from small to large or other arrangements. In addition, in another exemplary embodiment, it can also be defined that the first bit counted from the left is the MSB, and the second bit counted from the left is the LSB.

Figure 8:
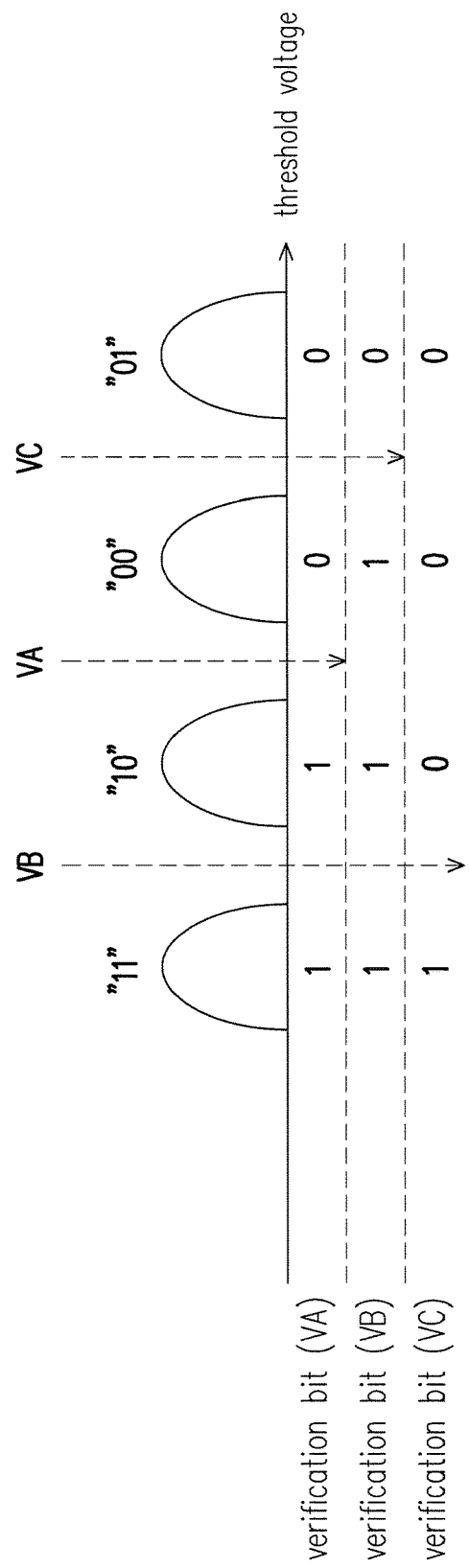
FIG. 8 illustrates a schematic diagram for reading data from a memory cell according to an exemplary embodiment of the invention, which uses a MLC NAND flash memory for example.

FIG. 8 illustrates a schematic diagram for reading data from a memory cell according to an exemplary embodiment of the invention, which uses a MLC NAND flash memory for example.

Referring to FIG. 8, in a reading operation for the memory cells of the memory cell array 502, the read voltage is applied to the control gate, and data stored in the memory cells are identified according whether the channel of the memory cell is turned on. A verification bit (VA) is configured to indicate whether the channel of the memory cell is turned on when a read voltage VA is applied; a verification bit (VC) is configured to indicate whether the channel of the memory cell is turned on when a read voltage VC is applied; and a verification bit (VB) is configured to indicate whether the channel of the memory cell is turned on when a read voltage VB is applied. It is assumed that the corresponding channel of the memory cell being turned on is indicated by the verification bit being "1," and the corresponding channel of the memory cell not being turned on is indicated by the verification bit being "0." As shown in FIG. 8, which of the storage statuses the memory cell is in may be determined according to the verification bits (VA) to (VC), thereby obtaining the bits being stored.

Figure 9:
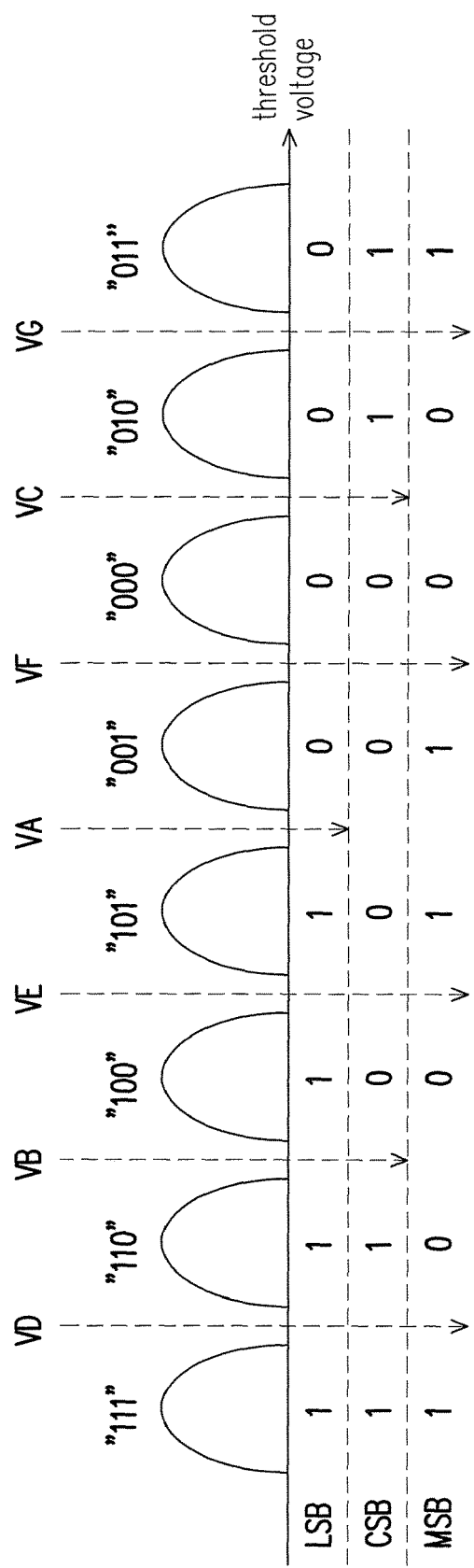
FIG. 9 illustrates a schematic diagram for reading data from a memory cell array according to another exemplary embodiment of the invention.

FIG. 9 illustrates a schematic diagram for reading data from a memory cell array according to another exemplary embodiment of the invention.

Referring to FIG. 9 which takes a TLC NAND flash memory for example, each of the storage statues includes a first bit counted from the left being the least significant bit (LSB), a second bit counted from the left being a center significant bit (CSB) and a third bit counted from the left being the most significant bit (MSB). In this embodiment, the memory cell includes eight storage statuses depended on different threshold voltages (i.e., "111," "110," "100," "101," "001," "000," "010," and "011.") The bits stored in the memory cell may be identified by applying the read voltages VA to VG to the control gate. Therein, it should be noted that, an arranging sequence of the eight storage statuses may be decided based on designs of manufacturers without being limited by the arranging sequence of this embodiment.

Figure 10:
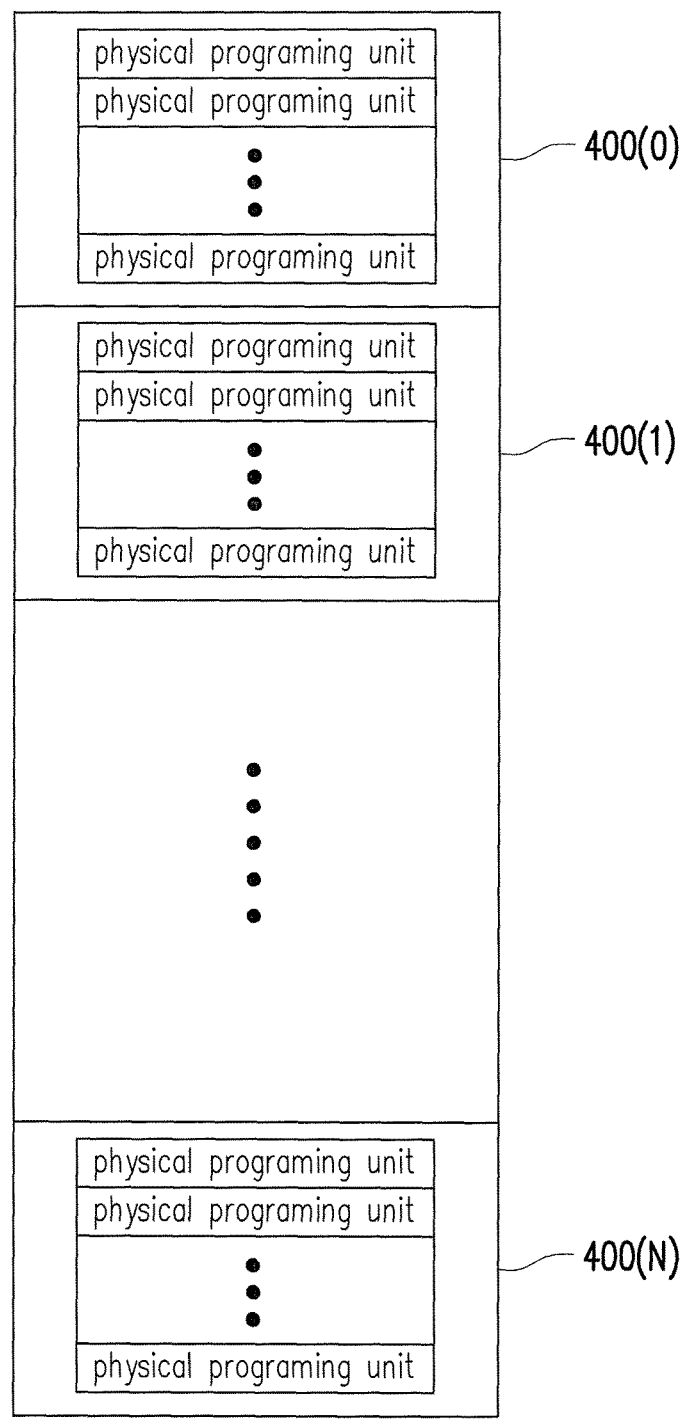
FIG. 10 is a schematic diagram illustrating management of a rewritable non-volatile memory module according to an exemplary embodiment of the invention.

FIG. 10 is a schematic diagram illustrating management of a rewritable non-volatile memory module according to an exemplary embodiment of the invention.

Referring to FIG. 10, the memory cells 602 of the rewritable non-volatile memory module 406 constitute a plurality of physical programming units, and the physical programming units constitute a plurality of physical erasing units 400(0) to 400(N). Specifically, the memory cells on the same word line constitute one or more of the physical programming units. If each of the memory cells can store more than one bits, the physical programming units on the same word line can be classified into a lower physical programming unit and an upper physical programming unit. For instance, the LSB of each memory cell belongs to the lower physical programming unit, and the MSB of each memory cell belongs to the upper physical programming unit. Generally, in the MLC NAND flash memory, a writing speed of the lower physical programming unit is faster than a writing speed of the upper physical programming unit. In addition, under normal circumstances, a reliability of the lower physical programming unit is higher than a reliability of the upper physical programming unit.

In this exemplary embodiment, the physical programming unit is a minimum unit for programming. That is, the physical programming unit is the minimum unit for writing data. For example, the physical programming unit is a physical page or a physical sector. When the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not limited in the invention. On the other hand, the physical erasing unit is the minimal unit for erasing. Namely, each physical erasing unit contains the least number of memory cells to be erased together. For instance, the physical erasing unit is a physical block.

Figure 11:
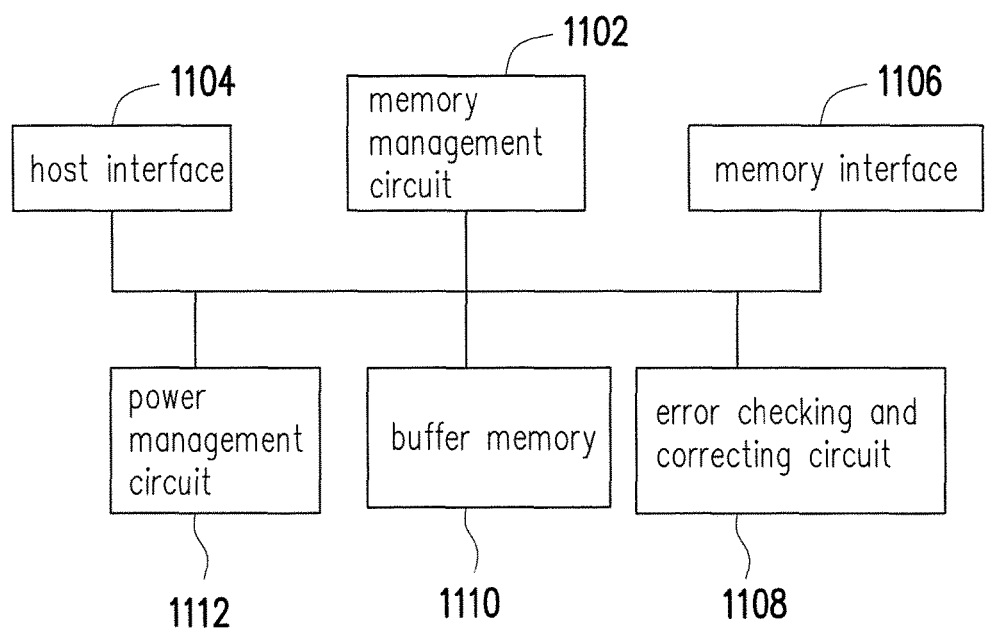
FIG. 11 is a schematic block diagram illustrating a memory controlling circuit unit according to an exemplary embodiment of the invention.

FIG. 11 is a schematic block diagram illustrating a memory controlling circuit unit according to an exemplary embodiment of the invention. It should be understood that, the structure of the memory controlling circuit unit depicted in FIG. 11 is only an example, and the invention is not limited thereto.

Referring to FIG. 11, the memory controlling circuit unit 404 includes a memory management circuit 1102, a host interface 1104, a memory interface 1106 and an error checking and correcting circuit 1108.

The memory management circuit 1102 is configured to control overall operations of the memory controlling circuit unit 404. Specifically, the memory management circuit 1102 has a plurality of control commands. During operations of the memory storage device 10, the control commands are executed to execute various operations such as writing, reading and erasing data. The operations of the memory controlling circuit unit 404 are similar to the operations of the memory management circuit 1102, thus related description is omitted hereinafter.

In the present exemplary embodiment, the control commands of the memory management circuit 1102 are implemented in a form of a firmware. For instance, the memory management circuit 1102 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment of the invention, the control commands of the memory management circuit 1102 may also be stored as program codes in a specific area (for example, the system area in a memory exclusively used for storing system data) of the rewritable non-volatile memory module 406. In addition, the memory management circuit 1102 has a microprocessor unit (not illustrated), a ROM (not illustrated) and a RAM (not illustrated). Particularly, the ROM has an activate code, which is executed by the microprocessor unit to load the control commands stored in the rewritable non-volatile memory module 406 to the RAM of the memory management circuit 1102 when the memory controlling circuit unit 404 is enabled. Thereafter, the control commands are executed by the microprocessor unit to execute operations of writing, reading or erasing data.

Further, in another exemplary embodiment of the invention, the control commands of the memory management circuit 1102 may also be implemented in a form of hardware. For example, the memory management circuit 1102 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical blocks of the rewritable non-volatile memory module 406; the memory writing circuit is configured to issue a write command to the rewritable non-volatile memory module 406 in order to write data into the rewritable non-volatile memory module 406; the memory reading circuit is configured to issue a read command to the rewritable non-volatile memory module 406 in order to read data from the rewritable non-volatile memory module 406; the memory erasing circuit is configured to issue an erase command to the rewritable non-volatile memory module 406 in order to erase data from the rewritable non-volatile memory module 406; the data processing circuit is configured to process both the data to be written to the rewritable non-volatile memory module 406 and the data to be read from the rewritable non-volatile memory module 406.

The host interface 1104 is coupled to the memory management circuit 1102 and configured to receive and identify commands and data sent from the host system 11. In other words, the commands and data sent from the host system 11 are passed to the memory management circuit 1102 through the host interface 1104. In the present exemplary embodiment, the host interface 1104 is compatible with a SATA standard. However, it should be understood that the present invention is not limited thereto, and the host interface 1104 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 1106 is coupled to the memory management circuit 1102 and configured to access the rewritable non-volatile memory module 406. That is, data to be written to the rewritable non-volatile memory module 406 is converted to a format acceptable to the rewritable non-volatile memory module 406 through the memory interface 1106. Specifically, if the memory management circuit 1102 intends to access the rewritable non-volatile memory module 406, the memory interface 1106 sends corresponding command sequences. The command sequences may include one or more signals, or data from the bus. For example, in a read command sequence, information such as identification codes and memory addresses are included.

The error checking and correcting circuit 1108 is coupled to the memory management circuit 1102 and configured to execute an error checking and correcting process to ensure the correctness of data. Specifically, when the memory management circuit 1102 receives the write command from the host system 11, the error checking and correcting circuit 1108 generates an error correcting code (ECC) and/or an error detecting code (EDC) for data corresponding to the write command, and the memory management circuit 1102 writes the data and the ECC and/or the EDC corresponding to the write command into the rewritable non-volatile memory module 406. Subsequently, when the memory management circuit 1102 reads the data from the rewritable non-volatile memory module 406, the corresponding ECC and/or the EDC is also read from the rewritable non-volatile memory module 106, so that the error checking and correcting circuit 1108 can execute the error checking and correcting procedure on the read data based on the ECC and/or the EDC. In this exemplary embodiment, a low density parity code (LDPC) is used by the error checking and correcting circuit 1108. However, in another exemplary embodiment, the error checking and correcting circuit 1108 may also use a BCH code, a convolutional code, a turbo code, but the invention is not limited thereto.

In an exemplary embodiment, the memory controlling circuit unit 404 further includes a buffer memory 1110 and a power management circuit 1112.

The buffer memory 1110 is coupled to the memory management circuit 1102 and configured to temporarily store data and commands from the host system 11 or data from the rewritable non-volatile memory module 406.

The power management unit 1112 is coupled to the memory management circuit 1102 and configured to control a power of the memory storage device 10.

In the low density parity code, a valid codeword is defined by a parity check matrix. The parity check matrix is marked as a matrix H and a codeword is marked as CW hereinafter.

According to an equation (1) below, if a result calculated by multiplying the parity check matrix H by the codeword CW is a zero vector, it indicates that the codeword CW is the valid codeword. Therein, an operator $\otimes$ represents a mod 2 matrix multiplication. In other words, a null space of the matrix H includes all the valid codewords. However, a content of the codeword CW is not particularly limited in the invention. For instance, the codeword CW may also include the error correcting code or the error detecting code generated by using any algorithm.

$$H \otimes CW^T = 0 \tag{1}$$

Therein, a dimension of the matrix H is k-by-n, and a dimension of the codeword CW is 1-by-n. Therein, k and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n-k), and a dimension of the vector P is 1-by-k. Hereinafter, the message bits and the parity bits are collectively referred to as data bits. In other words, the codeword CW includes n bits, in which a length of the message bits is (n-k) bits, and a length of the parity bits is k bits. Namely, a code rate of the codeword CW is (n-k)/n.

Generally, a generation matrix (marked as G hereinafter) is used during decoding, so that an equation (2) below may be satisfied by arbitrary values of the vector M. Therein, a dimension of the generation matrix G is (n-k)-by-n.

$$M \otimes G = [MP] = CW \tag{2}$$

Therein, the codeword CW generated by the equation (2) is the valid codeword. Therefore, when the equation (2) is substituted into the equation (1), an equation (3) below may be obtained accordingly.

$$H \otimes G^T \otimes M^T = 0 \tag{3}$$

Since the vector M may be arbitrary values, an equation (4) below may definitely be satisfied. In other words, after the parity check matrix H is decided, the corresponding generation matrix G may also be decided.

$$H \otimes G^T = 0 \tag{4}$$

When decoding the codeword CW, a parity check procedure is first performed on the data bits in the codeword. For instance, the parity check matrix H may be multiplied by the codeword CW to generate a vector (hereinafter, marked as S, as shown in an equation (5) below). If the vector S is the zero vector, the codeword CW may be directly outputted. If the vector S is not the zero vector, it indicates that the codeword CW is not the valid codeword.

$$H \otimes CW^T = S \tag{5}$$

A dimension of the vector S is k-by-1, in which each element is referred to as a syndrome. If the codeword CW is not the valid codeword, the error checking and correcting circuit 1108 may perform a decoding procedure attempting to correct an error bit in the codeword C W.

Figure 12:
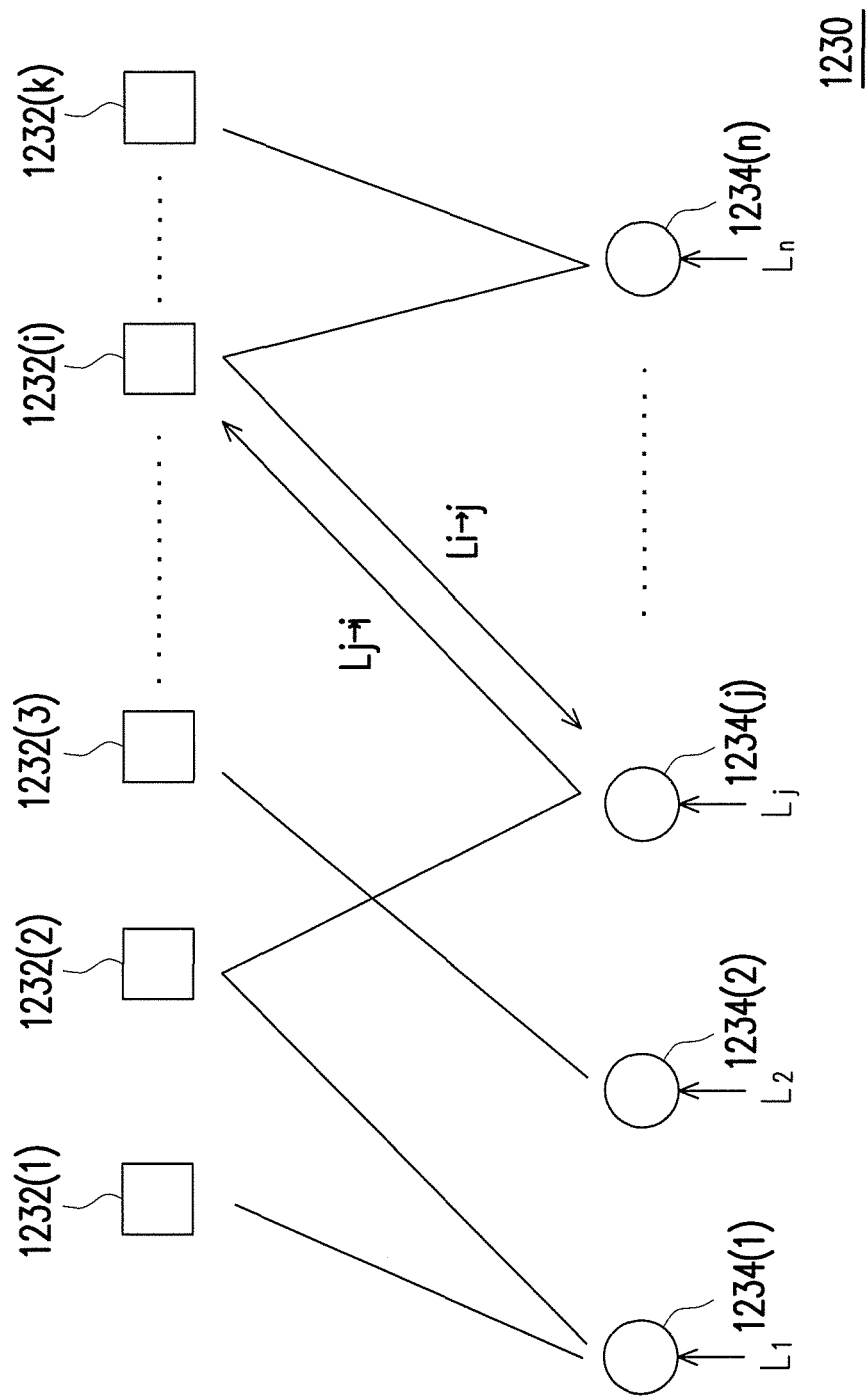
FIG. 12 is a schematic diagram illustrating a parity check matrix according to an exemplary embodiment of the invention.

FIG. 12 is a schematic diagram illustrating a parity check matrix according to an exemplary embodiment of the invention.

Referring to FIG. 12, generally, the parity check matrix H may be represented by a bipartite graph 1230 which includes parity nodes 1232(1) to 1232(k) and message nodes 1234(1) to 1234(n). Each of the parity nodes 1232(1) to 1232(k) is corresponding to one syndrome, and each of the message nodes 1234(1) to 1234(n) is corresponding to one data bit. Corresponding relations between the data bits and the syndromes (i.e., connecting relation between the message nodes 1234(1) to 1234(n) and the parity nodes 1232(1) to 1232(k)) is generated according to the parity check matrix. More specifically, if an element at a $i^{th}$ column and a $j^{th}$ row is 1, a $i^{th}$ parity node 1232(i) is connected to a $j^{th}$ message node 1234(j), and i and j are positive integers.

When the memory management circuit 1102 reads a n number of data bits (which forms one codeword) from the rewritable non-volatile memory module 406, the memory management circuit 1102 may also obtain channel reliability information of each of the data bits. The channel reliability information is used to represent probability (or known as a reliance level) for one specific data bit to be decoded into "1" or "0," detailed description thereof will be provided below. In the bipartite graph 1230, the message nodes 1234(1) to 1234(n) may also receive the corresponding channel reliability information. For instance, the message node 1232(1) may receive channel reliability information $L_1$ of a first data bit, and the message node 1232(j) may receive channel reliability information $L_j$ of a $j^{th}$ data bit.

The error checking and correcting circuit 1108 may execute the decoding procedure according to a structure of the bipartite graph 1230 and the channel reliability information $L_1$ to $L_n$. The decoding procedure may include an iterative decoding. Specifically, in the iterative decoding, the message nodes 1234(1) to 1234(n) may calculate and provide the reliability information to the parity nodes 1232(1) to 1232(k), and the parity nodes 1232(1) to 1232(k) may also calculate and provide the reliability information to the message nodes 1234(1) to 1234(n). The reliability information is transmitted along edges in the bipartite graph 1230. For instance, the reliability information $L_{i \to j}$ is transmitted from the parity node 1232(i) to the message node 1234(j), and the reliability information $L_{j \to i}$ is transmitted from the message node 1234(j) to the parity node 1232(i). The reliability information is used to represent probabilities (or, the reliance level) of one specific data bit to be decoded into "1" or "0," which is considered by one node. For instance, the reliability information L represents the reliance level (which may be positive or negative) for the $j^{th}$ data bit being decoded into "1" or "0" which is considered by the message node 1234(j), the reliability information $L_{i \to j}$ represents the reliance level for the $j^{th}$ data bit being decoded into "1" or "0" which is considered by the message node 1232(i). The message nodes 1234(1) to 1234(n) and the parity nodes 1232(1) to 1232(k) may calculate reliability information to be outputted according to the reliability information being inputted, which is similar to that in calculating the conditional probabilities of one specific data bit to be decoded into "1" or "0." Therefore, above-mentioned process of transmitting the reliability information is also known as a belief propagation.

Based on different algorithms being adopted, different reliability information may be calculated by the message nodes 1234(1) or 1234(n) and/or the parity nodes 1232(1) to 1232(k). For instance, the error checking and correcting circuit 1108 may adopt a Sum-Product Algorithm, a Min-Sum Algorithm, or a bit-flipping Algorithm, but the algorithm being adopted is not particularly limited in the invention.

In each iteration of the iterative decoding, the message nodes 1234(1) to 1234(n) may transmit the reliability information to the parity nodes 1232(1) to 1232(k), and the parity nodes 1232(1) to 1232(k) may transmit the reliability information to the message nodes 1234(1) to 1234(n). After each iteration, the message nodes 1234(1) to 1234(n) may calculate the probabilities of each data bit to be decoded into "1"

or "0" according to the current reliability information. Subsequently, the parity check procedure is executed on the calculated data bit. Namely, the codeword generated by the data bit is multiplied by the parity check matrix, so as to determine whether such codeword is the valid codeword. If the generated codeword is the valid codeword, the iterative decoding is stopped. If the generated codeword is not the valid codeword, the next iteration is executed. When a number of iterations in the iterative decoding exceeds a preset value, the iterative decoding is also stopped, indicating that the decoding fails.

Figure 13:
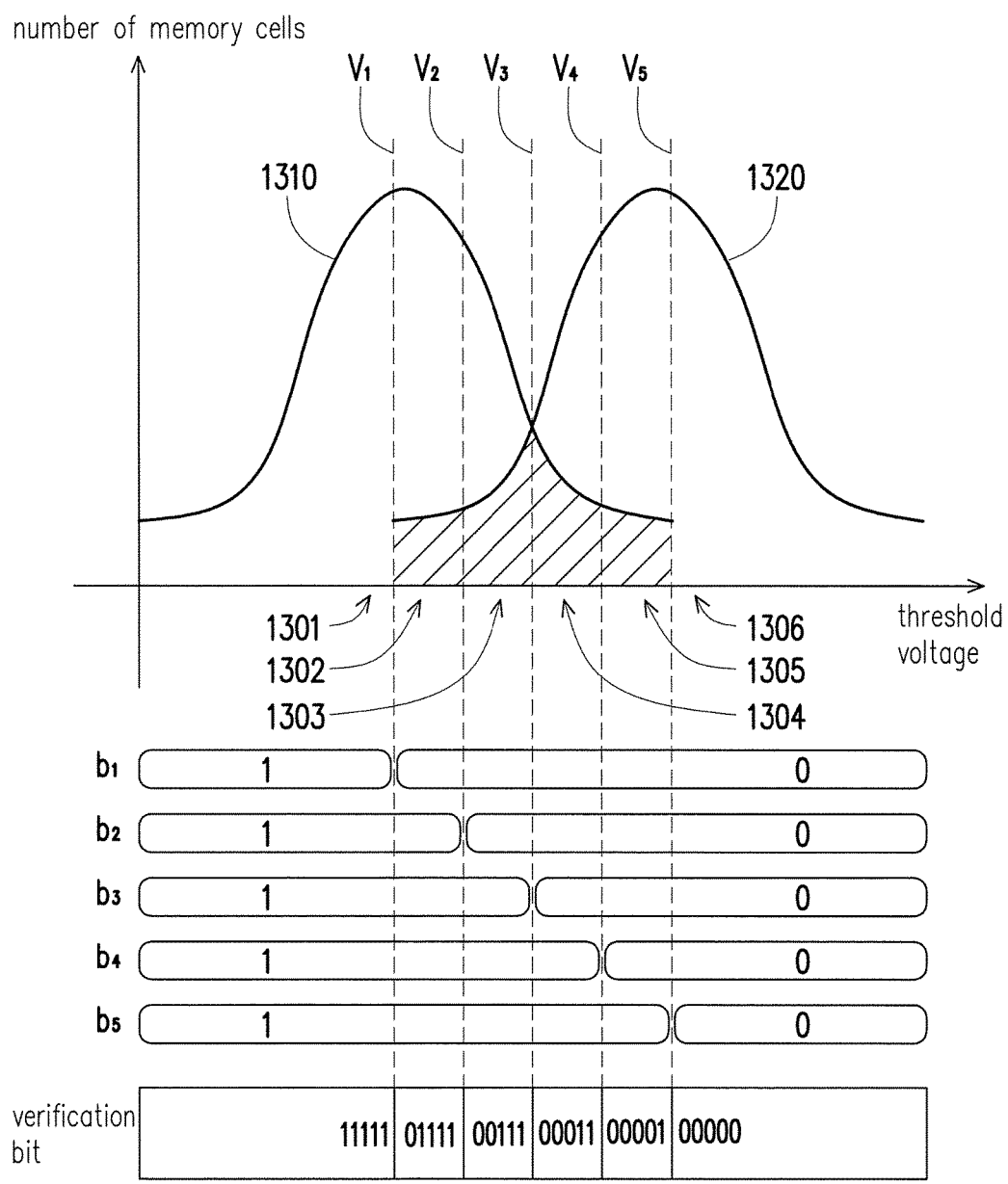
FIG. 13 illustrates a schematic diagram for reading a verification bit according to an exemplary embodiment of the invention.

FIG. 13 illustrates a schematic diagram for reading a verification bit according to an exemplary embodiment of the invention. Referring to FIG. 13, it is assumed that the memory cell in a storage status 1310 stores the bit "1," and the memory cell in a storage status 1320 stores the bit "0." The storage status 1310 may be partially overlapped with the storage status 1320, namely, under some specific read voltages, a part of the memory cells in the storage status 1310 may be determined as belonging to the storage status 1320, and a part of the memory cells in the storage status 1320 may be determined as belonging to the storage status 1310. In an exemplary embodiment, when a read voltage is applied to the control gate of the memory cell, the verification bit obtained by the memory management circuit 1102 may be "0" or "1" depended on whether the channel of the memory cell is turned on. Hereinafter, it is assumed that the corresponding verification bit is "0" when the channel of the memory cell is not turned on; otherwise, it is "1." When the memory management circuit 1102 applies read voltages $V_1$ to $V_5$ to one specific memory cell, 5 verification bits may be obtained by the memory management circuit 1102. More specifically, the read voltage $V_1$ is corresponding to the verification bit $b_1$; the read voltage $V_2$ is corresponding to the verification bit $b_2$; the read voltage $V_3$ is corresponding to the verification bit $b_3$; the read voltage $V_4$ is corresponding to the verification bit $b_4$; and the read voltage $V_5$ is corresponding to the verification bit $b_5$. The memory management circuit 1102 may obtain the verification bit from the verification bit $b_1$ to the verification bit $b_5$ in following manner: when the threshold voltage of one memory cell falls within an interval 1301, the verification bit is "11111"; when the threshold voltage of one memory cell falls within an interval 1302, the verification bit is "01111"; when the threshold voltage of one memory cell falls within an interval 1303, the verification bit is "00111"; when the threshold voltage of one memory cell falls within an interval 1304, the verification bit is "00011"; when the threshold voltage of one memory cell falls within an interval 1305, the verification bit is "00001"; and when the threshold voltage of one memory cell falls within an interval 1306, the verification bit is "00000." In another exemplary embodiment, the rewritable non-volatile memory module 406 may also transmit, after calculating the verification bits $b_1$ to $b_5$, the calculated verification bits to the memory management circuit 1102. For instance, an exclusive OR calculation may be executed on the verification bits $b_2$ and $b_4$, an exclusive OR calculation may be executed on the verification bits $b_1$ and $b_5$. Accordingly, only 3 verification bits are obtained by the memory management circuit 1102. However, a number and a content of the verification bits are not particularly limited in the invention.

In this exemplary embodiment, one of the read voltages $V_1$ to $V_5$ is set to a sign read voltage. The sign read voltage is used to decide the data bit. For instance, if the read voltage $V_3$ is a sign read voltage, the data bit is identical to the verification bit $b_3$; and if the read voltage $V_2$ is the sign read voltage, the data is identical to the verification bit $b_2$, and the rest may be deduced by analogy. In each interval, based on the probability of the memory cell belonging to the storage status 1310 and the probability of the memory cell belonging to the storage status 1320, a log likelihood ratio (LLR) may be calculated, and the log likelihood ratio is also known as the channel reliability information of the data bits in this exemplary embodiment. In an exemplary embodiment, the log likelihood ratio corresponding to each of the intervals may be calculated and stored in a lookup table in advance. The memory management circuit 1102 may input the verification bits $b_1$ to $b_5$ to the lookup table, so as to obtain the corresponding log likelihood ratio to serve as the channel reliability information. The obtained channel reliability information (i.e., $L_1$ to $L_n$ in FIG. 12) may be used to execute said iterative decoding. In an exemplary embodiment, when different sign read voltages are set, the channel reliability information may be obtained by using different lookup tables.

In the foregoing exemplary embodiment, if a number of the read voltages is x, a (x+1) number of the intervals can be divided, and x is a positive integer. However, in another exemplary embodiment, if a number of the read voltages is x, a y number of the intervals can be divided, and y may be any positive integers. The invention is not intended to limit the number of the intervals produced from the x number of the read voltages. If the number of the read voltages is 1 (e.g., only the read voltage $V_3$ is used), the decoding procedure being executed is also known as a hard bit mode decoding procedure. If the number of the read voltages is greater than 1, the decoding procedure being executed is also known as a soft bit mode decoding procedure. Generally, information used by the soft bit mode decoding procedure is relatively more, such that more of error bits may be corrected, but an executing speed thereof is slower. Further, in an exemplary embodiment, when the hard bit mode decoding procedure is executed, the memory management circuit 1102 may calculate the channel reliability information directly through the obtained verification bit without using the lookup table. For instance, if the verification bit is "1," the channel reliability information may be set to z; and if the verification bit is "0," the channel reliability information may be set to –z, in which z is a real number.

In the present exemplary embodiment, if the memory management circuit 1102 receives a read command from the host system 11 or performs a data arrangement procedure such as block merging or garbage collecting procedures, the memory management circuit 1102 may send a read command sequence (also known as a first read command sequence) to the rewritable non-volatile memory module 406. The first read command sequence includes one or more program codes or instruction codes. The first read command sequence instructs to read one or more data from a plurality of memory cells in the rewritable non-volatile memory module 406. Take reading data from one physical programming unit for example, this data may include a plurality of bits. After the bits are obtained, the error checking and correcting circuit 1108 performs a decoding (also known as a first decoding) on the bits. In the present exemplary embodiment, the first decoding may be aforesaid iteration decoding or any decoding procedures capable of finding errors. If one or more errors are found by the first decoding, the memory management circuit 1102 determines whether each of the found errors belongs to a first type error or a second type error.

In this exemplary embodiment, the first type error refers to a source error. For example, if a specific one of the found errors is an error generated by noise jamming during the data transmission to the rewritable non-volatile memory module 406, that error belongs to the first type error. Alternatively, if a specific one of the found errors is an error induced during the process of programming the memory cells, that error also belongs to the first type error. Take FIG. 7 for example, it is assumed that during a programming process of the MSB of one specific memory cell, if the programming process is influenced by the LSB of the specific memory cell, the specific memory cell originally to be stored with the bit "11" (correct) are programmed to be stored with the bit "01" (the error occurs) instead. Later, when the bit of the specific memory cell is read for decoding, the decoding may not be successful despite use of the hard bit mode decoding procedure, the soft bit mode decoding procedure or any decoding algorithms. For example, the correct bit may not be obtained regardless of how the read voltage VA is adjusted. Alternatively, even if the error belonging to the first type error can be found, a great amount of time may be consumed. In other words, a major reason that the first type error being generated is usually because the error already occurs when writing data instead of a usage time of the memory cell being too long, or a reading count, a writing count or an erasing count of the memory cell being too many. On the other hand, the second type error may be regarded as various error types excluding the first type error. For example, the second type error may be an error induced by the usage time of the memory cell being too long, or the reading count, the writing count or the erasing count of the memory cell being too many. Further, in another exemplary embodiment, other specific error types may also be classified into the first type error or the second type error, or a third type error and/or a fourth type error may also be further distinguished, which are not particularly limited in the invention.

In the present exemplary embodiment, if one specific error (also known as a first error) in the found errors belongs to the first type error, the memory management circuit 1102 records related information of the first error (e.g., which is recorded in the rewritable non-volatile memory module 406). The related information of the first error may include at least one of information regarding the data where the error occurs, the memory cell where the error occurs, a location of the memory cell where the error occurs, a bit in the data where the error occurs (also known as an error bit), whether the memory cell where the error occurs belongs to the upper physical programming unit or the lower physical programming unit, and another one or more bits stored by the memory cell where the error occurs (also known as a reference bit). In addition, the related information of the first error may also include any useful information, which is not particularly limited in the invention. It is worth mentioning that, the related information of the first error as mentioned herein is not used in the current decoding. For example, in the present exemplary embodiment, the related information of the first error is recorded only after the data where the error occurs is corrected (i.e., after the data is successfully decoded). Furthermore, in another exemplary embodiment, the related information of the first error may also be recorded at any time point. On the other hand, if the first error belongs to the second type error, the memory management circuit 1102 does not record the related information of the first error. In other words, in the conventional method, the location of the error bit in the data is recorded as long as the error occurs in the data. However, the related information of the first error herein is recorded only if the found first error belongs to the first type error. Accordingly, a data quantity of the data to be stored may be reduced. Take the iteration decoding for example, it is assumed that one data to be decoded is "11111111." In this case, if it is found that second and fifth bits in the data are corrected after the iteration decoding is successfully performed on the data (e.g., the data outputted by the error checking and correcting circuit 1108 is "11011011,") the memory management circuit 1102 determines whether errors in the second and fifth bits belong to the first type error. Assuming that the error of the second bit belongs to the second type error and the error of the fifth bit belongs to the first type error, the related information of the error of the fifth bit will be recorded while the related information of the error of the second bit will not be recorded.

In an exemplary embodiment, the memory management circuit 1102 obtains channel reliability information of a bit (i.e., the error bit) corresponding to the first error in the bits. The method of obtaining the channel reliability information may refer to the foregoing description, which is not repeated hereinafter. The memory management circuit 1102 may determine whether a value of the channel reliability information is greater than a threshold (also known as a reliability threshold). Particularly, because an initial value of the channel reliability information may be negative, an absolute value of the channel reliability information is used to compare with the reliability threshold. If the value of the channel reliability information is greater than the reliability threshold, the memory management circuit 1102 determines that the first error belongs to the first type error. If the value of the channel reliability information is not greater than the reliability threshold, the memory management circuit 1102 determines that the first error belongs to the second type error.

In an exemplary embodiment, the memory management circuit 1102 identifies a memory cell (also known as a first memory cell) corresponding to the first error in the memory cells. In other words, the first memory cell refers to a memory cell that is stored with the error bit corresponding to the first error. The memory management circuit 1102 may determine whether another bit (i.e., the reference bit) read from the first memory cell is one specific value (also known as a first value). Herein, the reference bit is not the error bit corresponding to the first error in the bits. In the present exemplary embodiment, the first value is "1." However, in another exemplary embodiment, the first value may be "0." If the reference bit is the first value, the memory management circuit 1102 determines that the first error belongs to the first type error. If the reference bit is not the first value, the memory management circuit 1102 determines that the first error belongs to the second type error. In the present exemplary embodiment, the reference bit and the error bit corresponding to the first error in the bits are stored in the same multi level cell or the same trinary level cell. For example, in the present exemplary embodiment, the error bit corresponding to the first error is the LSB in the first memory cell, and the reference bit is the MSB in the first memory cell. More specifically, in the present exemplary embodiment, the memory cells belong to the same lower physical programming unit and belong to the same upper physical programming unit, the error bit corresponding to the first error is corresponding to the lower physical programming unit, and the reference bit is corresponding to the upper physical programming unit. Take FIG. 7 for example, assuming that the error bit found by the decoding is the LSB of one specific memory cell and a corrected value thereof is "1" (e.g., which is corrected from "0" to be "1,") if the MSB of the specific memory cell is also "1," it indicates that the bit stored by the specific memory cell is supposed to be "11"

but being mistakenly programmed into the bit "01" instead. This type of error that occurs during the data transmission or programming is the first type error.

However, in another exemplary embodiment, the reference bit may also be read from a memory cell neighboring to the first memory cell or any memory cell with useful information, which are not particularly limited in the invention. In addition, the reference bit may be read together with the error bit corresponding to the first error. Alternatively, the reference bit may also be read together with another data independently before or after the error bit is read, which is not particularly limited in the invention. Besides, an amount of the reference bit may be one or more, but the invention is not limited thereto. For example, if the first memory cell is the multi level cell, the amount of the reference bit is one, and if the first memory cell is the trinary level cell, the amount of the reference bit may be one or two.

After recording the related information of one or more errors belonging to the first type error in one specific data, the related information may be used the next when the specific data is read. For example, in an exemplary embodiment, after the related information of one or more errors belonging to the first type error in one specific data is recorded, if the memory management circuit 1102 receives another read command from the host system 11 or performs the data arrangement procedure such as block merging or garbage collecting procedure, the memory management circuit 1102 sends a read command sequence (also known as a second read command sequence) to the rewritable non-volatile memory module 406. The second read command sequence includes one or more program codes or instruction codes. The second read command sequence instructs to read the data from the memory cells in the rewritable non-volatile memory module 406. Generally, if the first read command sequence and the second command sequence both read the same memory cells and the data in the data in these memory cells is not erased, the data obtained according to the second read command sequence is identical to the data obtained according to the first read command sequence. Before the error checking and correcting circuit 1108 performs a decoding (also known as a second decoding) on a plurality of bits in the data, the memory management circuit 1102 or the error checking and correcting circuit 1108 reads the related information of the first type error regarding the data (which is previously recorded) from the rewritable non-volatile memory module 406 and corrects the bits according to the related information. For example, the one or more error bits corresponding to the first type error may be corrected. Then, the error checking and correcting circuit 1108 performs the second decoding on the corrected bit. Accordingly, by correcting the error bits having the first type error which is hard to find before the decoding, a speed for performing the subsequent decoding may be effectively improved.

In an exemplary embodiment, if the memory management circuit 1102 determines that the read data includes the first type error, after the data is corrected, the memory management circuit 1102 sends a write command sequence to the rewritable non-volatile memory module 406. The write command sequence includes one or more program codes or instruction codes. The write command sequence is configured to instruct writing the corrected bits into the memory cells where the bits are stored. Accordingly, when the data is read from the same memory cells the next time, it is highly possible that the first type error previously detected will not exist in the read data. Particularly, in this exemplary embodiment, because the data including the first type error is instantly corrected and rewritten into the corresponding memory cell, the memory management circuit 1102 does not have to record the related information of the first type error. Accordingly, memory space can be saved.

However, in another exemplary embodiment, the memory management circuit 1102 does not update the data in the memory cells each time when the first type error is found. For example, the memory management circuit 1102 may accumulate a total of one or more errors belonging to the first type error in the read bits and determine whether the total is greater than a threshold (also known as an error threshold). If the total is greater than the error threshold, the memory management circuit 1102 sends the write command sequence to write the corrected bits into the memory cells where the bits are stored. If the total is not greater than the error threshold, the memory management circuit 1102 does not send the write command sequence. Accordingly, it can prevent the memory cells from being read and written too frequently. In an exemplary embodiment, the error threshold may be 10 to 30 (or more or less). Take the error threshold being 10 for example, if the total of the errors belonging to the first type error in one specific data is 8, the related information of the first type error in the specific data is recorded for use in a next decoding, but the corrected data may not yet be rewritten into the memory cells where the data is stored. However, if the total of the errors belonging to the first type error in one specific data is 11, not only the related information of the first type error in the specific data is recorded, the corrected data may also be rewritten into the memory cells where the data is stored.

In another exemplary embodiment assuming that the memory management circuit 1102 reads data including a plurality of bits from one specific memory cell, after it is determined that the bits include the first type error and the data is corrected, the memory management circuit 1102 may send a write command sequence to the rewritable non-volatile memory module 406. The write command sequence includes one or more program codes or instruction codes. The write command sequence is configured to instruct writing the corrected bits into another memory cell. The memory cell to be written with the corrected bits is not identical to the memory cell originally stored with the bits. In other words, in this exemplary embodiment, the memory cell which is identified as storing with the data including the first type error is abandoned, and the data stored by the memory cell is corrected and moved to other memory cell, so as to reduce a probability for errors to occur on the data again in the future. In addition, if the read data does not include the first type error (e.g., only includes the second type error), after the data is corrected, the memory management circuit 1102 may directly output the bits. In this exemplary embodiment, because the data including the first type error is instantly corrected and rewritten into the corresponding memory cell, the memory management circuit 1102 does not have to record the related information of the first type error. Accordingly, memory space can be saved.

Further, in an exemplary embodiment, the operation of rewriting the corrected data into the corresponding memory cell may be performed instantly or performed only at a specific time point. The specific time point may be any time not affecting a normal operation of the user. For example, the specific time point may be a time point after the rewritable non-volatile memory module 406 is idle for a period of time, a time point after starting up, a time point before shutting down, or a time point decided by the user, which are not particularly limited in the invention. Alternatively, in an exemplary embodiment, the memory management circuit 1102 may automatically read the data from a part of memory cells of the rewritable non-volatile memory module 406 per one period of time or at said specific time point, and perform the operations of finding the first type error in the data and correcting the data stored in the memory cell. In other words, because the first type error cannot be easily induced by the usage time of the memory cell being too long, or the reading count, the writing count or the erasing count of the memory cell being too many, as long as the bits having the first type error in the memory cell are corrected, an efficiency for performing decoding on the same data may be effectively improved.

Figure 14:
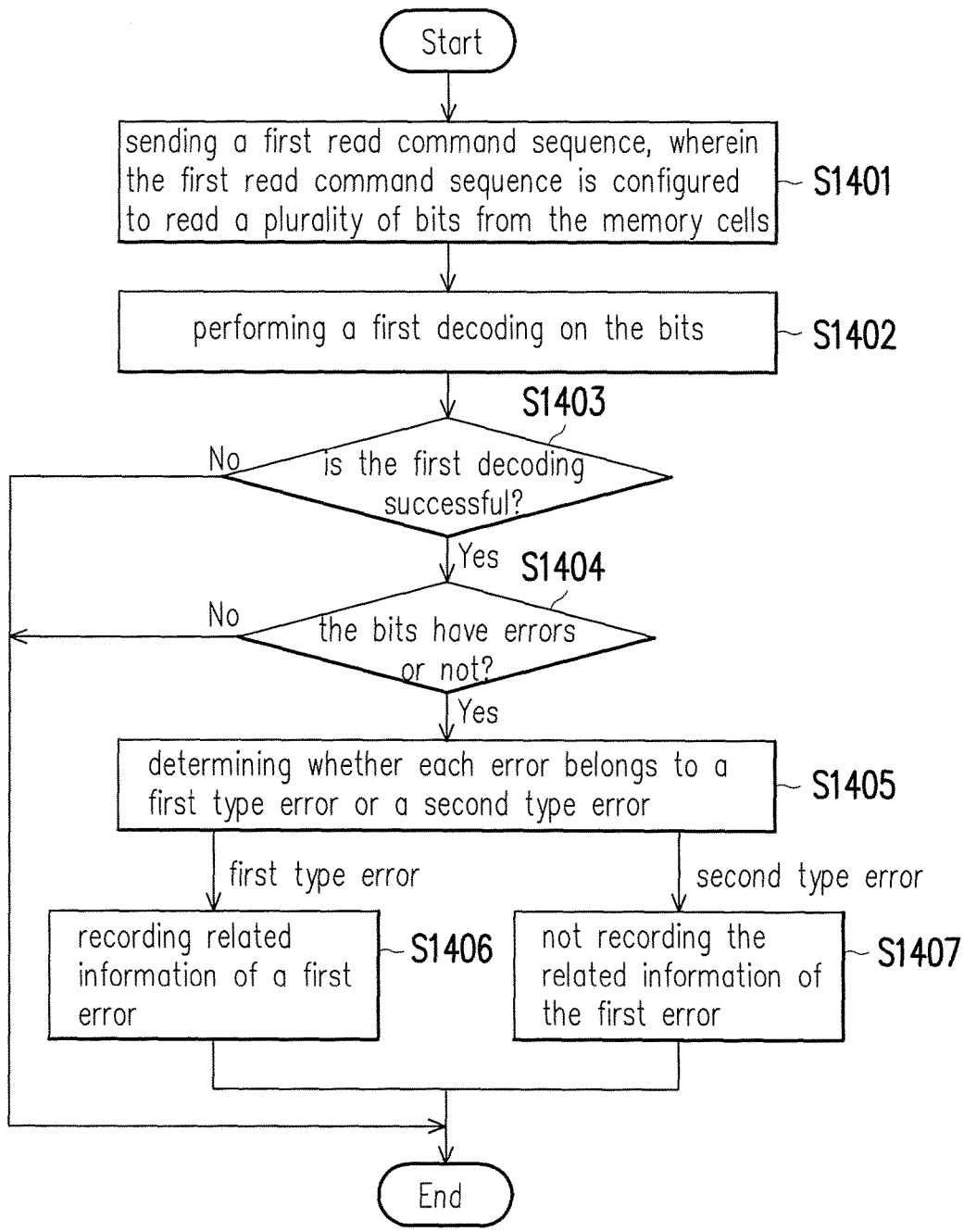
FIG. 14 is a flowchart illustrating an error processing method according to an exemplary embodiment of the invention.

FIG. 14 is a flowchart illustrating an error processing method according to an exemplary embodiment of the invention.

Referring to FIG. 14, in step S1401, a first read command sequence is sent, in which the first read command sequence is configured to read a plurality of bits from the memory cells. In step S1402, a first decoding is performed on the bits. In step S1403, whether the first decoding is successful is determined. If the first decoding is unsuccessful, for example, operations such as adjusting the read voltage to re-read the memory cells may be performed, which are not particularly limited in the invention. If the first decoding is successful, in step S1404, whether the bits have errors is determined. If the bits do not have any error, for example, operations such as outputting the bits may be performed, which are not particularly limited. If the bits have at least one error, in step S1405, whether each error belongs to a first type error or a second type error is determined. Herein, an example is provided in which whether a first error in the errors belongs to the first type error or the second type error is determined. If the first error belongs to the first type error, in step S1406, related information of the first error is recorded. If the first error belongs to the second type error, in step S1407, the related information of the first error is not recorded. Steps S1405 to S1407 are performed repeatedly until all the errors are checked. In addition, in another exemplary embodiment, step S1407 may also be skipped.

Figure 15:
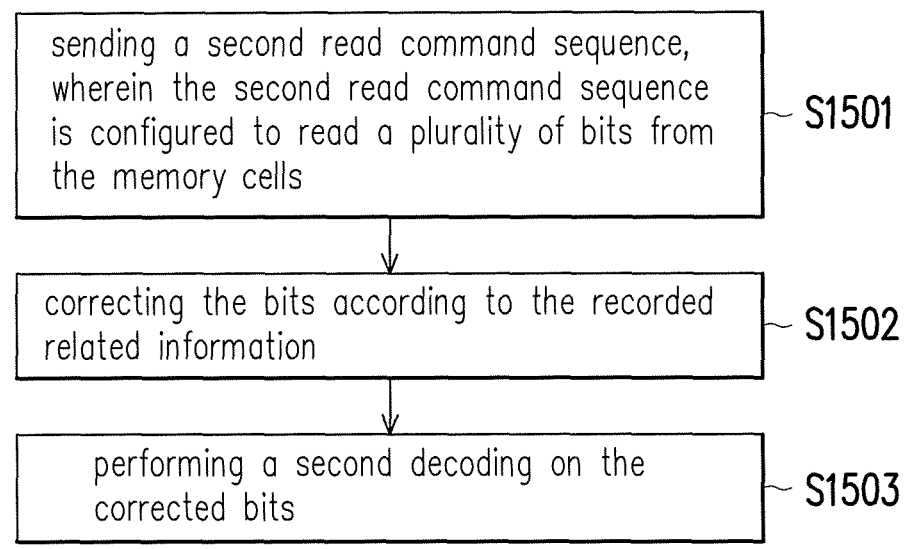
FIG. 15 is a flowchart illustrating an error processing method according to another exemplary embodiment of the invention.

FIG. 15 is a flowchart illustrating an error processing method according to another exemplary embodiment of the invention.

Referring to FIG. 15, in step S1501, a second read command sequence is sent, in which the second read command sequence is configured to read a plurality of bits from the memory cells. In this exemplary embodiment, at least one reading and decoding has been performed on the bits, and the related information of the errors belonging to the first type error in the bits has also been recorded. In step S1502, the bits are corrected according to the recorded related information. Specifically, step S1502 refers to a step of correcting the error bits having the first type error in the bits. After correcting the error bits having the first type error in the bits, in step S1503, a second decoding is performed on the corrected bits.

Nevertheless, each of steps depicted in FIG. 14 and FIG. 15 have been described in detail as above, thus related description thereof is not repeated hereinafter. It should be noted that, the steps depicted in FIG. 14 and FIG. 15 may be implemented as a plurality of program codes or circuits, which are not particularly limited in the invention. Moreover, the methods disclosed in FIG. 14 and FIG. 15 may be implemented with reference to above embodiments, or may be implemented separately, which are not particularly limited in the invention.

In summary, after the first decoding is performed on the read data, if errors with particular type exist in the data, the related information of the errors will be recorded. Then, when the next decoding is performed on the same data, the errors with the particular type are corrected first in order to increase the speed for performing the subsequent decoding. Alternatively, after the errors with the particular type are corrected, the data may be rewritten into the corresponding memory cell, so as to avoid the same correction being performed each time when the data is read again. Furthermore, the related information of errors not belonging to the particular type will not be recorded to save the memory space.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An error processing method for a rewritable non-volatile memory module comprising a plurality of memory cells, and the error processing method comprising:
    sending a first read command sequence, wherein the first read command sequence is configured to read a plurality of bits from the memory cells;
    performing a first decoding on the bits;
    if the bits have at least one error, correcting the at least one error, and determining whether each of the at least one corrected error belongs to a first type error or a second type error according to the step of the correcting the at least one error, wherein the first type error is different from the second type error, and if a value of channel reliability information is greater than a reliability threshold, the at least one corrected error is determined belonging to the first type error;
    if a first error in the at least one error belongs to the first type error, recording related information of the first error; and
    if the first error belongs to the second type error, not recording the related information of the first error.

2. The error processing method of claim 1, wherein the step of determining whether each of the at least one error belongs to the first type error or the second type error comprises:
    obtaining the channel reliability information of an error bit, wherein the error bit corresponds to the first error in the bits;
    determining whether a value of the channel reliability information is greater than a reliability threshold; and
    if the value of the channel reliability information is not greater than the reliability threshold, determining that the first error belongs to the second type error.

3. The error processing method of claim 1, further comprising:

sending a second read command sequence, wherein the second read command sequence is configured to read a plurality of first bits included in the bits from the memory cells;
correcting the bits according to the recorded related information; and
performing a second decoding on the corrected bits.

4. The error processing method of claim 1, further comprising:
accumulating a total of at least one error belonging to the first type error in the bits;
determining whether the total is greater than an error threshold; and
if the total is greater than the error threshold, sending a write command sequence, wherein the write command sequence is configured to write the corrected bits into the memory cells.

5. The error processing method of claim 1, wherein the second type error is regarded as usage time of the memory cell being larger than a first threshold, or a reading count, a writing count or an erasing count of the memory cell being larger than a second threshold.

6. An error processing method for a rewritable non-volatile memory module comprising a plurality of memory cells, and the error processing method comprising:
sending a first read command sequence, wherein the first read command sequence is configured to read a plurality of bits from the memory cells;
performing a first decoding on the bits;
if the bits have at least one error, correcting the at least one error, and determining whether each of the at least one corrected error belongs to a first type error or a second type error according to the step of the correcting the at least one error, wherein the first type error is different from the second type error, and the step of determining whether each of the at least one error belongs to the first type error or the second type error comprises:
identifying a first memory cell corresponding to a first error in the memory cells;
determining whether a reference bit read from the first memory cell is a first value, wherein an error bit corresponding to the first error in the bits is not the reference bit;
if the reference bit is the first value, determining that the first error belongs to the first type error; and
if the reference bit is not the first value, determining that the first error belongs to the second type error;
if the first error in the at least one error belongs to the first type error, recording related information of the first error; and
if the first error belongs to the second type error, not recording the related information of the first error.

7. The error processing method of claim 6, wherein the first memory cell comprises the error bit and the reference bit, the error bit is stored in a lower physical programming unit and the reference bit is stored in an upper physical programming unit.

8. A memory storage device, comprising:
a connection interface unit, configured to couple to a host system;
a rewritable non-volatile memory module comprising a plurality of memory cells; and
a memory controlling circuit unit, coupled to the connection interface unit and the rewritable non-volatile memory module,
wherein the memory controlling circuit unit is configured to send a first read command sequence, wherein the first read command sequence is configured to read a plurality of bits from the memory cells,
the memory controlling circuit unit is further configured to perform a first decoding on the bits,
if the bits have at least one error, the memory controlling circuit unit is further configured to correct the at least one error and determine whether each of the at least one corrected error belongs to a first type error or a second type error according to the operation of correcting the at least one error, wherein the first type error is different from the second type error, and if a value of channel reliability information is greater than a reliability threshold, the at least one corrected error is determined belonging to the first type error,
if a first error in the at least one error belongs to the first type error, the memory controlling circuit unit is further configured to record related information of the first error, and
if the first error belongs to the second type error, the memory controlling circuit unit does not record the related information of the first error.

9. The memory storage device of claim 8, wherein the operation of the memory controlling circuit unit determining whether each of the at least one error belongs to the first type error or the second type error comprises:
obtaining the channel reliability information of an error bit, wherein the error bit corresponds to the first error in the bits;
determining whether a value of the channel reliability information is greater than a reliability threshold; and
if the value of the channel reliability information is not greater than the reliability threshold, determining that the first error belongs to the second type error.

10. The memory storage device of claim 8, wherein the memory controlling circuit unit is further configured to send a second read command sequence, wherein the second read command sequence is configured to read a plurality of first bits included in the bits from the memory cells,
the memory controlling circuit unit is further configured to correct the bits according to the recorded related information and perform a second decoding on the corrected bits.

11. The memory storage device of claim 8, wherein the memory controlling circuit unit is further configured to accumulate a total of at least one error belonging to the first type error in the bits and determine whether the total is greater than an error threshold,
if the total is greater than the error threshold, the memory controlling circuit unit sends a write command sequence, wherein the write command sequence is configured to write the corrected bits into the memory cells.

12. The memory storage device of claim 8, wherein the second type error is regarded as usage time of the memory cell being larger than a first threshold, or a reading count, a writing count or an erasing count of the memory cell being larger than a second threshold.

13. A memory storage device, comprising:
a connection interface unit, configured to couple to a host system;
a rewritable non-volatile memory module comprising a plurality of memory cells; and
a memory controlling circuit unit, coupled to the connection interface unit and the rewritable non-volatile memory module,
wherein the memory controlling circuit unit is configured to send a first read command sequence, wherein the first read command sequence is configured to read a plurality of bits from the memory cells, the memory controlling circuit unit is further configured to perform a first decoding on the bits, if the bits have at least one error, the memory controlling circuit unit is further configured to correct the at least one error and determine whether each of the at least one corrected error belongs to a first type error or a second type error according to the operation of correcting the at least one error, wherein the first type error is different from the second type error, and the operation of the memory controlling circuit unit determining whether each of the at least one error belongs to the first type error or the second type error comprises:

identifying a first memory cell corresponding to a first error in the memory cells;

determining whether a reference bit read from the first memory cell is a first value, wherein an error bit corresponding to the first error in the bits is not the reference bit;

if the reference bit is the first value, determining that the first error belongs to the first type error; and if the reference bit is not the first value, determining that the first error belongs to the second type error, wherein if the first error in the at least one error belongs to the first type error, the memory controlling circuit unit is further configured to record related information of the first error, and if the first error belongs to the second type error, the memory controlling circuit unit does not record the related information of the first error.

14. The memory storage device of claim 13, wherein the first memory cell comprises the error bit and the reference bit, the error bit is stored in a lower physical programming unit and the reference bit is stored in an upper physical programming unit.

15. A memory controlling circuit unit, configured to control a rewritable non-volatile memory module, wherein the rewritable non-volatile memory module comprises a plurality of memory cells, and the memory controlling circuit unit comprises:

a host interface, configured to couple to a host system;

a memory interface, configured to couple to the rewritable non-volatile memory module, wherein the rewritable non-volatile memory module comprises a plurality of memory cells;

an error checking and correcting circuit; and a memory management circuit coupled to the host interface, the memory interface and the error checking and correcting circuit, wherein the memory management circuit is configured to send a first read command sequence, wherein the first read command sequence is configured to read a plurality of bits from the memory cells, the error checking and correcting circuit is configured to perform a first decoding on the bits, if the bits have at least one error, the error checking and correcting circuit is further configured to correct the at least one error and the memory management circuit is further configured to determine whether each of the at least one corrected error belongs to a first type error or a second type error according to the operation of correcting the at least one error by the error checking and correcting circuit, wherein the first type error is different from the second type error, and if a value of channel reliability information is greater than a reliability threshold, the at least one corrected error is determined belonging to the first type error, if a first error in the at least one error belongs to the first type error, the memory management circuit is further configured to record related information of the first error, and if the first error belongs to the second type error, the memory management circuit does not record the related information of the first error.

16. The memory controlling circuit unit of claim 15, wherein the operation of the memory management circuit determining whether each of the at least one error belongs to the first type error or the second type error comprises:

obtaining the channel reliability information of an error bit, wherein the error bit corresponds to the first error in the bits;

determining whether a value of the channel reliability information is greater than a reliability threshold; and if the value of the channel reliability information is not greater than the reliability threshold, determining that the first error belongs to the second type error.

17. The memory controlling circuit unit of claim 15, wherein the memory management circuit is further configured to send a second read command sequence, wherein the second read command sequence is configured to read a plurality of first bits included in the bits from the memory cells, the memory management circuit is further configured to correct the bits according to the recorded related information, and the error checking and correcting circuit is further configured to perform a second decoding on the corrected bits.

18. The memory controlling circuit unit of claim 15, wherein the memory management circuit is further configured to accumulate a total of at least one error belonging to the first type error in the bits and determine whether the total is greater than an error threshold, and if the total is greater than the error threshold, the memory management circuit is further configured to send a write command sequence, wherein the write command sequence is configured to write the corrected bits into the memory cells.

19. The memory controlling circuit unit of claim 15, wherein the second type error is regarded as usage time of the memory cell being larger than a first threshold, or a reading count, a writing count or an erasing count of the memory cell being larger than a second threshold.

20. A memory controlling circuit unit, configured to control a rewritable non-volatile memory module, wherein the rewritable non-volatile memory module comprises a plurality of memory cells, and the memory controlling circuit unit comprises:

a host interface, configured to couple to a host system;

a memory interface, configured to couple to the rewritable non-volatile memory module, wherein the rewritable non-volatile memory module comprises a plurality of memory cells;

an error checking and correcting circuit; and a memory management circuit coupled to the host interface, the memory interface and the error checking and correcting circuit, wherein the memory management circuit is configured to send a first read command sequence, wherein the first read command sequence is configured to read a plurality of bits from the memory cells, the error checking and correcting circuit is configured to perform a first decoding on the bits, if the bits have at least one error, the error checking and correcting circuit is further configured to correct the at least one error and the memory management circuit is further configured to determine whether each of the at least one corrected error belongs to a first type error or a second type error according to the operation of correcting the at least one error by the error checking and correcting circuit, wherein the first type error is different from the second type error, wherein the operation of the memory management circuit determining whether each of the at least one error belongs to the first type error or the second type error comprises:
- identifying a first memory cell corresponding to a first error in the memory cells;
- determining whether a reference bit read from the first memory cell is a first value, wherein an error bit corresponding to the first error in the bits is not the reference bit;
- if the reference bit is the first value, determining that the first error belongs to the first type error; and
- if the reference bit is not the first value, determining that the first error belongs to the second type error, wherein if the first error in the at least one error belongs to the first type error, the memory management circuit is further configured to record related information of the first error, and if the first error belongs to the second type error, the memory management circuit does not record the related information of the first error.

21. The memory controlling circuit unit of claim 20, wherein the first memory cell comprises the error bit and the reference bit, the error bit is stored in a lower physical programming unit and the reference bit is stored in an upper physical programming unit.

22. An error processing method for a rewritable non-volatile memory module comprising a plurality of memory cells, and the error processing method comprising:
- sending a first read command sequence, wherein the first read command sequence is configured to read a plurality of bits from a first memory cell in the memory cells;
- performing a first decoding on the bits;
- if the bits have at least one error, correcting the at least one error, and determining whether each of the at least one corrected error belongs to a first type error or a second type error according to the step of correcting the at least one error, wherein the first type error is different from the second type error, and if a value of channel reliability information is greater than a reliability threshold, the at least one corrected error is determined belonging to the first type error;
- if the at least one error includes the first type error, sending a write command sequence, wherein the write command sequence is configured to write the corrected bits into a second memory cell in the memory cells; and
- if each of the at least one error belongs to the second type error, outputting the corrected bits, wherein the first memory cell is different from the second memory cell.

23. The error processing method of claim 22, wherein the step of determining whether each of the at least one error belongs to the first type error or the second type error comprises:
- obtaining the channel reliability information of an error bit, wherein the error bit corresponds to a first error of the at least one error in the bits; and
- determining whether a value of the channel reliability information is greater than a reliability threshold.

24. The error processing method of claim 22, wherein the second type error is regarded as usage time of the memory cell being larger than a first threshold, or a reading count, a writing count or an erasing count of the memory cell being larger than a second threshold.

25. An error processing method for a rewritable non-volatile memory module comprising a plurality of memory cells, and the error processing method comprising:
- sending a first read command sequence, wherein the first read command sequence is configured to read a plurality of bits from a first memory cell in the memory cells;
- performing a first decoding on the bits;
- if the bits have at least one error, correcting the at least one error, and determining whether each of the at least one corrected error belongs to a first type error or a second type error according to the step of correcting the at least one error, wherein the first type error is different from the second type error, wherein the step of determining whether each of the at least one error belongs to the first type error or the second type error comprises:
- determining whether a reference bit read from the first memory cell is a first value, wherein an error bit corresponding to a first error of the at least one error in the bits is not the reference bit; and
- if the reference bit is the first value, determining that the first error belongs to the first type error, wherein if the at least one error includes the first type error, sending a write command sequence, wherein the write command sequence is configured to write the corrected bits into a second memory cell in the memory cells; and if each of the at least one error belongs to the second type error, outputting the corrected bits, wherein the first memory cell is different from the second memory cell.

26. The error processing method of claim 25, wherein the first memory cell comprises the error bit and the reference bit, the error bit is stored in a lower physical programming unit and the reference bit is stored in an upper physical programming unit.

27. A memory storage device, comprising:
- a connection interface unit, configured to couple to a host system;
- a rewritable non-volatile memory module comprising a plurality of memory cells; and
- a memory controlling circuit unit, coupled to the connection interface unit and the rewritable non-volatile memory module, wherein the memory controlling circuit unit is configured to send a first read command sequence, wherein the first read command sequence is configured to read a plurality of bits from a first memory cell in the memory cells, the memory controlling circuit unit is further configured to perform a first decoding on the bits, if the bits have at least one error, the memory controlling circuit unit is further configured to correct the at least one error and determine whether each of the at least one corrected error belongs to a first type error or a second type error according to the operation of correcting the at least one error, wherein the first type error is different from the second type error, and if a value of channel reliability information is greater than a reliability threshold, the at least one corrected error is determined belonging to the first type error, if the at least one error includes the first type error, the memory controlling circuit unit is further configured to send a write command sequence, wherein the write command sequence is configured to write the corrected bits into a second memory cell in the memory cells, and if each of the at least one error belongs to the second type error, the memory controlling circuit unit is further configured to output the corrected bits, wherein the first memory cell is different from the second memory cell.

28. The memory storage device of claim 27, wherein the operation of the memory controlling circuit unit determining whether each of the at least one error belongs to the first type error or the second type error comprises:

obtaining the channel reliability information of an error bit, wherein the error bit corresponds to a first error of the at least one error in the bits; and determining whether a value of the channel reliability information is greater than a reliability threshold.

29. The memory storage device of claim 27, wherein the second type error is regarded as usage time of the memory cell being larger than a first threshold, or a reading count, a writing count or an erasing count of the memory cell being larger than a second threshold.

30. A memory storage device, comprising:

a connection interface unit, configured to couple to a host system;

a rewritable non-volatile memory module comprising a plurality of memory cells; and a memory controlling circuit unit, coupled to the connection interface unit and the rewritable non-volatile memory module, wherein the memory controlling circuit unit is configured to send a first read command sequence, wherein the first read command sequence is configured to read a plurality of bits from a first memory cell in the memory cells, the memory controlling circuit unit is further configured to perform a first decoding on the bits, if the bits have at least one error, the memory controlling circuit unit is further configured to correct the at least one error and determine whether each of the at least one corrected error belongs to a first type error or a second type error according to the operation of correcting the at least one error, wherein the first type error is different from the second type error, wherein the operation of the memory controlling circuit unit determining whether each of the at least one error belongs to the first type error or the second type error comprises:

determining whether a reference bit read from the first memory cell is a first value, wherein an error bit corresponding to a first error of the at least one error in the bits is not the reference bit; and if the reference bit is the first value, determining that the first error belongs to the first type error, wherein if the at least one error includes the first type error, the memory controlling circuit unit is further configured to send a write command sequence, wherein the write command sequence is configured to write the corrected bits into a second memory cell in the memory cells, and if each of the at least one error belongs to the second type error, the memory controlling circuit unit is further configured to output the corrected bits, wherein the first memory cell is different from the second memory cell.

31. The memory storage device of claim 12, wherein the first memory cell comprises the error bit and the reference bit, the error bit is stored in a lower physical programming unit and the reference bit is stored in an upper physical programming unit.

32. A memory controlling circuit unit, configured to control a rewritable non-volatile memory module, wherein the rewritable non-volatile memory module comprises a plurality of memory cells, and the memory controlling circuit unit comprises:

a host interface, configured to couple to a host system;

a memory interface, configured to couple to the rewritable non-volatile memory module, wherein the rewritable non-volatile memory module comprises a plurality of memory cells;

an error checking and correcting circuit; and a memory management circuit, coupled to the host interface, the memory interface and the error checking and correcting circuit, wherein the memory management circuit is configured to send a first read command sequence, wherein the first read command sequence is configured to read a plurality of bits from a first memory cell in the memory cells, the error checking and correcting circuit is configured to perform a first decoding on the bits, if the bits have at least one error, the error checking and correcting circuit is further configured to correct the at least one error and the memory management circuit is further configured to determine whether each of the at least one corrected error belongs to a first type error or a second type error according to the operation of correcting the at least one error by the error checking and correcting circuit, wherein the first type error is different from the second type error, and if a value of channel reliability information is greater than a reliability threshold, the at least one corrected error is determined belonging to the first type error, if the at least one error includes the first type error, the memory management circuit is further configured to send a write command sequence, wherein the write command sequence is configured to write the corrected bits into a second memory cell in the memory cells, and if each of the at least one error belongs to the second type error, the memory management circuit is further configured to output the corrected bits, wherein the first memory cell is different from the second memory cell.

33. The memory controlling circuit unit of claim 32, wherein the operation of the memory management circuit determining whether each of the at least one error belongs to the first type error or the second type error comprises:

obtaining the channel reliability information of an error bit, wherein the error bit corresponds to a first error of the at least one error in the bits; and determining whether a value of the channel reliability information is greater than a reliability threshold.

34. The memory controlling circuit unit of claim 32, wherein the second type error is regarded as usage time of the memory cell being larger than a first threshold, or a reading count, a writing count or an erasing count of the memory cell being larger than a second threshold.

35. A memory controlling circuit unit, configured to control a rewritable non-volatile memory module, wherein the rewritable non-volatile memory module comprises a plurality of memory cells, and the memory controlling circuit unit comprises:
- a host interface, configured to couple to a host system;
- a memory interface, configured to couple to the rewritable non-volatile memory module, wherein the rewritable non-volatile memory module comprises a plurality of memory cells;
- an error checking and correcting circuit; and
- a memory management circuit, coupled to the host interface, the memory interface and the error checking and correcting circuit,
- wherein the memory management circuit is configured to send a first read command sequence, wherein the first read command sequence is configured to read a plurality of bits from a first memory cell in the memory cells,
- the error checking and correcting circuit is configured to perform a first decoding on the bits,
- if the bits have at least one error, the error checking and correcting circuit is further configured to correct the at least one error and the memory management circuit is further configured to determine whether each of the at least one corrected error belongs to a first type error or a second type error according to the operation of correcting the at least one error by the error checking and correcting circuit, wherein the first type error is different from the second type error,
- wherein the operation of the memory management circuit determining whether each of the at least one error belongs to the first type error or the second type error comprises:
  - determining whether a reference bit read from the first memory cell is a first value, wherein an error bit corresponding to a first error of the at least one error in the bits is not the reference bit; and
  - if the reference bit is the first value, determining that the first error belongs to the first type error,
- wherein if the at least one error includes the first type error, the memory management circuit is further configured to send a write command sequence, wherein the write command sequence is configured to write the corrected bits into a second memory cell in the memory cells, and
- if each of the at least one error belongs to the second type error, the memory management circuit is further configured to output the corrected bits,
- wherein the first memory cell is different from the second memory cell.

36. The memory controlling circuit unit of claim 35, wherein the first memory comprises the error bit and the reference bit, the error bit is stored in a lower physical programming unit and the reference bit is stored in an upper physical programming unit.

* * * * *